(12) United States Patent
Dei et al.

(10) Patent No.: US 9,434,609 B2
(45) Date of Patent: Sep. 6, 2016

(54) METHOD FOR FORMING PATTERN, AND POLYSILOXANE COMPOSITION

(71) Applicant: JSR CORPORATION, Tokyo (JP)

(72) Inventors: Satoshi Dei, Tokyo (JP); Takashi Mori, Tokyo (JP); Kazunori Takanashi, Tokyo (JP)

(73) Assignee: JSR Corporation, Tokyo (JP)

( * ) Notice: Subject to any disclaimer, the term of this patent is extended or adjusted under 35 U.S.C. 154(b) by 543 days.

(21) Appl. No.: 13/629,908

(22) Filed: Sep. 28, 2012

(65) Prior Publication Data

US 2015/0048046 A1  Feb. 19, 2015

(30) Foreign Application Priority Data

Sep. 29, 2011 (JP) ................. 2011-215756
Sep. 25, 2012 (JP) ................. 2012-211580

(51) Int. Cl.

| | |
|---|---|
| B81C 1/00 | (2006.01) |
| C08G 77/388 | (2006.01) |
| G03F 7/075 | (2006.01) |
| G03F 7/004 | (2006.01) |
| G03F 7/09 | (2006.01) |
| G03F 7/11 | (2006.01) |
| H05K 3/06 | (2006.01) |
| C08G 77/14 | (2006.01) |
| C08G 77/24 | (2006.01) |
| C09D 183/08 | (2006.01) |

(52) U.S. Cl.
CPC ....... *B81C 1/00396* (2013.01); *B81C 1/00388* (2013.01); *C08G 77/14* (2013.01); *C08G 77/24* (2013.01); *C08G 77/388* (2013.01); *C09D 183/08* (2013.01); *G03F 7/0046* (2013.01); *G03F 7/0752* (2013.01); *G03F 7/0757* (2013.01); *G03F 7/094* (2013.01); *G03F 7/11* (2013.01); *H05K 3/061* (2013.01); *B81C 2201/0198* (2013.01); *H05K 2203/05* (2013.01)

(58) Field of Classification Search
None
See application file for complete search history.

(56) References Cited

U.S. PATENT DOCUMENTS

| | | | | |
|---|---|---|---|---|
| 2002/0007018 A1* | 1/2002 | Foster | ................... | B41C 1/1008 525/328.8 |
| 2002/0187422 A1* | 12/2002 | Angelopoulos | ........ | C08G 77/20 430/270.1 |
| 2006/0079658 A1* | 4/2006 | Kato | ................... | G03F 7/0046 528/43 |
| 2009/0011372 A1* | 1/2009 | Ogihara | ................... | C08L 83/04 430/323 |
| 2009/0280438 A1* | 11/2009 | Kohno et al. | ................. | 430/323 |
| 2012/0184101 A1* | 7/2012 | Yasuda | ................... | G03F 7/40 438/676 |

FOREIGN PATENT DOCUMENTS

| | | |
|---|---|---|
| JP | 59-093448 B | 5/1984 |
| JP | 05-188598 | 7/1993 |
| JP | 06-012452 | 1/1994 |
| JP | 2001-284209 | 10/2001 |
| JP | 2005-352384 | 12/2005 |
| JP | 2008-039811 | 2/2008 |
| JP | 2010-085912 | 4/2010 |
| JP | 2012-053253 A | 3/2012 |
| JP | 2012-237975 A | 12/2012 |
| TW | 201234102 A | 8/2012 |
| TW | 201308016 A | 2/2013 |
| WO | WO 2008/059844 A1 | 5/2008 |
| WO | WO 2010/021290 A1 | 2/2010 |

OTHER PUBLICATIONS

Y. Abe and T. Gunji, "Oligo and Polysiloxanes", Progress in Polymer Science, vol. 29, year 2004, pp. 149-182.*
Office Action issued Sep. 15, 2015, in Japanese Patent Application No. 2012-211580 (w/ English translation).
Office Action issued Apr. 26, 2016 in Japanese Patent Application No. 2012-211580 (w/ English translation).
Office Action issued May 16, 2016, in Taiwan Patent Application No. 101135541 filed Sep. 27, 2012 (w/ English translation).

* cited by examiner

*Primary Examiner* — Jiong-Ping Lu
(74) *Attorney, Agent, or Firm* — Oblon, McClelland, Maier & Neustadt, L.L.P.

(57) ABSTRACT

A pattern-forming method in which processibility of a silicon-containing film in etching with a fluorine gas and resistance against etching with an oxygen gas can be together improved in a multilayer resist process to form a finer pattern. Provided is a pattern-forming method that includes the steps of (1) providing a silicon-containing film on the upper face side of a substrate to be processed using a polysiloxane composition; (2) forming a resist pattern on the silicon-containing film; (3) dry-etching the silicon-containing film using the resist pattern as a mask to form a silicon-containing pattern; and (4) dry-etching the substrate to be processed using the silicon-containing pattern as a mask to form a pattern, in which the polysiloxane composition includes (A) a polysiloxane containing a fluorine atom, and (B) a crosslinking accelerator.

13 Claims, No Drawings

METHOD FOR FORMING PATTERN, AND POLYSILOXANE COMPOSITION

BACKGROUND OF THE INVENTION

1. Field of the Invention

The present invention relates to a pattern-forming method, and a polysiloxane composition.

2. Discussion of the Background

In attempts to improve integrity along with miniaturization of semiconductor devices, etc., miniaturization of a processing size by multilayer resist processes using a silicon-containing film has progressed. In such multilayer resist processes, first, a silicon-containing film is provided on a substrate to be processed using a polysiloxane composition. Thereafter, a resist film is provided on the silicon-containing film using a resist composition. Next, the resist film is exposed through a mask pattern, and developed with a developer solution to obtain a resist pattern. Next, a silicon-containing pattern is formed by dry-etching of the silicon-containing film using an etching gas such as a fluorine gas using the resist pattern as a mask to obtain a substrate provided with a desired pattern by dry-etching using an etching gas such as an oxygen gas using the silicon-containing pattern as a mask (see Japanese Unexamined Patent Application, Publication Nos. 2001-284209, 2010-85912 and 2008-39811).

Today, also in the case in which such a multilayer resist process is used, further miniaturization of a pattern, a thinning thereby, and additionally an improvement of productivity have been demanded. Therefore, a silicon-containing film used has been demanded to have a high processibility, involving a high etching rate upon etching. On the other hand, the silicon-containing film used has been demanded to have a high etching resistance upon etching of a substrate to be processed and the like using a silicon-containing pattern as a mask.

However, according to the prior arts, an enhanced processibility of a silicon-containing film with a fluorine gas has a tendency to deteriorate resistance against an oxygen gas, and thus achieving both the high processibility and a high resistance has been reportedly difficult. Accordingly, a pattern-forming method has been demanded in which processibility in etching with a fluorine gas and resistance against etching with an oxygen gas of a silicon-containing film provided are both improved in a multilayer resist process, and a finer pattern can be formed.

PRIOR ART DOCUMENTS

Patent Documents

Patent Document 1: Japanese Unexamined Patent Application, Publication No. 2001-284209
Patent Document 2: Japanese Unexamined Patent Application, Publication No. 2010-85912
Patent Document 3: Japanese Unexamined Patent Application, Publication No. 2008-39811

SUMMARY OF THE INVENTION

The present invention was made in view of the foregoing circumstances, and an object of the invention is to provide a pattern-forming method in which the processibility in etching with a fluorine gas of a silicon-containing film and resistance against etching with an oxygen gas are together improved in a multilayer resist process, and a finer pattern can be formed.

One aspect of the present invention made for solving the foregoing problems provides a pattern-forming method, which includes the steps of:

(1) providing a silicon-containing film on the upper face side of a substrate to be processed using a polysiloxane composition;

(2) forming a resist pattern on the silicon-containing film;

(3) dry-etching the silicon-containing film using the resist pattern as a mask to form a silicon-containing pattern; and (4) dry-etching the substrate to be processed using the silicon-containing pattern as a mask to form a pattern, in which the polysiloxane composition contains (A) a polysiloxane containing a fluorine atom (hereinafter, may be also referred to as "polysiloxane (A)"), and (B) a crosslinking accelerator.

Since the pattern-forming method of the aspect of the present invention has the steps described above, and the composition that contains the polysiloxane (A) and the crosslinking accelerator (B) is used for providing a silicon-containing film, processibility in etching with a fluorine gas of the silicon-containing film and resistance against etching with an oxygen gas are together improved, and as a result, a finer pattern can be formed. Although it is not necessarily clear why the pattern-forming method achieves the effect, it is conjectured that, for example, due to the polysiloxane (A) including a fluorine atom an etching rate of the etching with a fluorine gas is improved, and that the improved etching rate of the etching with a fluorine gas and an improvement of the resistance against the etching with an oxygen gas by increasing a molecular weight of the polysiloxane (A) by the crosslinking accelerator (B) can be both achieved, and the like.

It is preferred that the step (2) includes the steps of:
(2-A1) providing a resist film on the silicon-containing film using a resist composition;
(2-A2) exposing the resist film by irradiating with exposure light through a photomask; and
(2-A3) developing the exposed resist film.

Due to forming the resist pattern by exposure and development using a resist composition, a pattern having a more favorable shape can be formed.

It is preferred that the method further includes the step of
(0) providing a resist underlayer film that is an organic film on the substrate to be processed,
the silicon-containing film is provided on the resist underlayer film in the step (1), and
the resist underlayer film is further dry-etched in the step (4).

In the case in which the resist underlayer film that is an organic film is provided between the substrate to be processed and the silicon-containing film in a multilayer resist process, effects of the present invention can be increased.

Another aspect of the present invention provides a polysiloxane composition containing:

(A) a polysiloxane containing a fluorine atom; and
(B) a crosslinking accelerator.

Due to the polysiloxane composition containing the polysiloxane (A) and the crosslinking accelerator (B), the processibility in etching with a fluorine gas of the silicon-containing film provided and the resistance against the etching with an oxygen gas can be both improved.

It is preferred that the polysiloxane (A) has a fluorinated hydrocarbon group which may be substituted. The polysiloxane (A) that has the structure can be conveniently synthesized.

It is preferred that the fluorinated hydrocarbon group is a fluorinated phenyl group. Due to use of the specific group as the fluorinated hydrocarbon group, the processibility of the silicon-containing film in etching with a fluorine gas and the resistance against etching with an oxygen gas can be together effectively improved.

It is preferred that the polysiloxane (A) is a hydrolytic condensation product of a compound that includes a silane compound represented by the following formula (1):

$$R^1_a R^2_b SiX_{4-a-b} \quad (1)$$

in the formula (1), $R^1$ represents a monovalent hydrocarbon group having a fluorine atom, wherein a part or all of hydrogen atoms contained in the hydrocarbon group may be substituted; $R^2$ represents a hydrogen atom or a monovalent hydrocarbon group, wherein the hydrocarbon group may be substituted with a group other than a fluorine atom and a group having a fluorine atom; X represents a halogen atom or $-OR^3$, wherein $R^3$ represents a monovalent organic group; a is an integer of 1 to 3; b is an integer of 0 to 2, wherein (a+b)≤3 is satisfied; and provided that the $R^1$, $R^2$ and X are each present in a plurality of number, the $R^1$s, $R^2$s and Xs present in a plurality of number may be each the same or different.

The polysiloxane (A) can be conveniently synthesized as a hydrolytic condensation product of a compound that includes the specific silane compound.

It is preferred that the crosslinking accelerator (B) is at least one selected from the group consisting of a nitrogen-containing compound and an onium salt compound. Due to the crosslinking accelerator (B) being the specific compound, an increase of molecular weight by crosslinking of the polysiloxane (A) can effectively proceed by appropriate basicity of the crosslinking accelerator (B).

It is preferred that the nitrogen-containing compound is at least one selected from the group consisting of an amine compound and a compound that generates an amine compound by heating. Due to the nitrogen-containing compound being the specific compound, basicity thereof becomes more appropriate, and as a result, an increase of molecular weight by crosslinking of the polysiloxane (A) can effectively proceed.

The term "organic group" as referred to herein means a group that includes at least one carbon atom.

As described above, according to the pattern-forming method of the present invention, the processibility of the provided silicon-containing film in etching with a fluorine gas and the resistance against etching with an oxygen gas can be together improved to form a finer pattern in a multilayer resist process.

DESCRIPTION OF EMBODIMENTS

Pattern-Forming Method

The pattern-forming method of the present invention includes the steps of:

(1) providing a silicon-containing film on the upper face side of a substrate to be processed using a polysiloxane composition;

(2) forming a resist pattern on the silicon-containing film;

(3) dry-etching the silicon-containing film using the resist pattern as a mask to form a silicon-containing pattern; and (4) dry-etching the substrate to be processed using the silicon-containing pattern as a mask to form a pattern, in which the polysiloxane composition contains (A) a polysiloxane containing a fluorine atom (hereinafter, may be also referred to as "polysiloxane (A)"), and (B) a crosslinking accelerator.

In addition, it is preferred that the pattern-forming method further includes the step of (0) providing a resist underlayer film that is an organic film on the substrate to be processed, the silicon-containing film is provided on the resist underlayer film in the step (1), and the resist underlayer film is further subjected to dry-etching in the step (4).

Hereinafter, each step will be explained.

Step (1)

In the step (1), a silicon-containing film is provided on the upper face side of a substrate to be processed using a polysiloxane composition. The polysiloxane composition is described later. As a substrate to be processed, a conventionally well-known substrate such as, for example, a silicon wafer or a wafer coated with aluminum may be used. In addition, an organic antireflective film disclosed in, for example, Japanese Examined Patent Application, Publication No. H06-12452 and/or Japanese Unexamined Patent Application, Publication No. S59-93448 may be provided on the substrate to be processed.

The coating method of the polysiloxane composition is exemplified by spin-coating, cast coating, roll coating, and the like. It is to be noted that the film thickness of the polysiloxane-containing film formed is typically 10 nm to 1,000 nm, preferably 10 nm to 500 nm, and more preferably 20 nm to 300 nm.

After the coating of the polysiloxane composition, a solvent in the coating film may be volatilized by prebaking (PB) as needed. The PB temperature is appropriately selected depending on the formulation of the polysiloxane composition, and is typically about 50° C. to 450° C. In addition, the PB time is typically about 5 seconds to 600 seconds.

Step (2)

In the step (2), a resist pattern is formed on the silicon-containing film. The method of forming a resist pattern in the step (2) may be exemplified by (2A) a method in which a resist composition is used, (2B) a method in which a nanoimprint lithography technique is employed, (2C) a method in which a directed self-assembly composition is used, and the like.

(2a) Method in which Resist Composition is Used

When carried out using a resist composition (2A), the step (2) may include, for example, the steps of:

(2-A1) providing a resist coating film on the silicon-containing film using a resist composition (hereinafter, may be also referred to as "step (2-A1)");

(2-A2) exposing the resist coating film by irradiating with exposure light through a photomask (hereinafter, may be also referred to as "step (2-A2)"); and (2-A3) developing the exposed resist film (hereinafter, may be also referred to as "step (2-A3)").

Step (2-A1)

In the step (2-A1), a resist coating film is provided on the silicon-containing film using a resist composition.

Examples of the resist composition include a positive type or negative type chemically amplified resist composition containing a photoacid generating agent, a positive type resist composition including an alkali-soluble resin and a quinonediazide sensitizer, a negative type resist composition including an alkali-soluble resin and a crosslinking agent, and the like.

The resist composition may have a solid content of usually about 5 to 50% by mass, and in general, the resist composition is used for providing the resist film after filtering through a filter with a pore size of about 0.2 μm, for example. It is to be noted that a commercially available resist composition may be used as is in this step.

The coating method and the thickness of the coating film of the resist composition are similar to those in the polysiloxane composition in the step (1). After the coating, PB is carried out as needed, whereby a solvent in the coating film is volatilized to provide a resist film. The PB temperature is appropriately selected depending on the formulation of the resist composition, and is typically about 30° C. to 200° C., preferably 50° C. to 150° C. In addition, the PB time is typically about 5 seconds to 600 seconds.

A protective film as disclosed in Japanese Patent Application Publication No. H05-188598 or the like may be provided on the resist layer in order to prevent the effects of basic impurities and the like contained in the environmental atmosphere. In order to prevent outflow of the photoacid generator (B) and the like from the resist layer, a liquid immersion lithography protective film as disclosed in Japanese Patent Application Publication No. 2005-352384 or the like may be provided on the resist film. These techniques may be used in combination.

Step (2-A2)

In the step (2-A2), the resist film provided in the step (2-A1) is exposed by irradiating with exposure light through a photomask. The exposure may be a liquid immersion lithography that is carried out through a liquid immersion liquid as needed. In addition, the exposure may be continuously carried out a plurality of times. It is to be noted that a liquid for liquid immersion used as needed upon exposure is exemplified by water, a fluorine inert liquid, and the like. The liquid for liquid immersion is preferably transparent to an exposed wavelength, and a liquid having as small as possible temperature coefficient of the refractive index such that a distortion of an optical image projected on the resist film can be kept minimum, and particularly in the case in which an exposure light source is an ArF excimer laser beam (wavelength: 193 nm), in addition to the viewpoints described above, water is preferably used in light of availability and handleability. The water used is preferably a distilled water or an ultra pure water. In the case in which water is used, a surfactant may be added in a small amount.

Examples of the exposure light used for exposure include electromagnetic waves such as an ultraviolet ray, a far ultraviolet ray, an X-ray and a γ-ray; charged particle rays such as an electron beam and an α-ray, and the like. Of these, a far ultraviolet ray is preferred, an ArF excimer laser beam and a KrF excimer laser beam (wavelength: 248 nm) are more preferred, and an ArF excimer laser beam is further preferred. Exposure conditions such as an exposure dose are appropriately selected depending on the formulation of the radiation-sensitive resin composition, and the like.

In addition, post-exposure baking (PEB) is preferably carried out after exposure. Due to carrying out PEB, a dissociation reaction, etc. of an acid-dissociable group of a polymer in the resist composition can smoothly proceed. The PEB temperature is typically 30° C. to 200° C., and preferably 50° C. to 170° C. In addition, the PEB time is typically 5 seconds to 600 seconds, and preferably 10 seconds to 300 seconds.

Step (2-A3)

In the step (2-A3), the resist film exposed in the step (2-A2) is developed, thereby resulting in forming a resist pattern. The developer solution that develops the resist film is exemplified by an alkaline developer, a developer solution having an organic solvent as a principal component, and the like.

Examples of the alkaline developer include an aqueous alkali solution obtained by dissolving at least one of alkaline compounds such as sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, ethyldimethylamine, triethanolamine, tetramethylammoniumhydroxide (TMAH), pyrrole, piperidine, choline, 1,8-diazabicyclo-[5.4.0]-7-undecene, 1,5-diazabicyclo-[4.3.0]-5-nonene, and the like. Of these, an aqueous TMAH solution is preferred. The concentration of the aqueous alkali solution is preferably no greater than 10% by mass, and more preferably no greater than 5% by mass. These alkaline compounds may be used either one type alone, or two or more types.

With respect to the developer solution having an organic solvent as a principal component, the proportion of the organic solvent contained in the developer solution is preferably no less than 80% by mass, and more preferably no less than 90% by mass in light of obtaining a favorable resist pattern. Examples of the organic solvents contained in the developer solution include an alcohol solvent, an ether solvent, a ketone organic solvent, an amide solvent, an ester organic solvent, a hydrocarbon solvent, and the like. Examples of these solvent include solvents exemplified as (C) a solvent in the polysiloxane composition described later, and the like. Of these, the organic solvent used for the developer solution is preferably an alcohol solvent, an ether solvent, a ketone solvent and an ester solvent, more preferably an ester solvent, further preferably n-butyl acetate, isopropyl acetate, n-butyl acetate and amyl acetate, and particularly preferably n-butyl acetate. These organic solvents may be used either one type alone, or two or more types in combination.

A surfactant may be added as needed to the developer solution in an appropriate amount. As the surfactant, for example, an ionic or nonionic fluorochemical surfactant and/or a silicon surfactant or the like may be used.

Examples of the development method include a dipping method that immerses the substrate in a container filled with the developer for a given time, a puddle method that allows the developer to be present on the surface of the substrate due to surface tension for a given time, a spraying method that sprays the developer onto the surface of the substrate, a dynamic dispensing method that applies the developer to the substrate that is rotated at a constant speed while scanning with a developer application nozzle at a constant speed, and the like.

The resist pattern formed after the development may be rinsed with a rinse agent. As the rinse liquid, water, preferably ultra pure water is typically used in development using the alkali, and organic solvents such as an alkane solvent, a ketone solvent, an ester solvent, an alcohol solvent and an amide solvent in development using the organic solvent. Among these, an alcohol solvent and an ester solvent are preferred, and a monohydric alcohol solvent having 6 to 8 carbon atoms is particularly preferred. Each component of the rinse agent may be used either alone, or two or more types in combination.

Examples of the rinsing method using the rinse agent include a spinning method that continues to apply the rinse agent to the substrate that is rotated at a constant speed, a dipping method that immerses the substrate in a container filled with the rinse agent for a given time, a spraying method that sprays the rinse agent onto the surface of the substrate, and the like.

After the development or the washing with the rinse agent, a desired resist pattern can be obtained by generally carrying out a dry treatment, etc.

Method in which a Nanoimprint Lithography Technique is Employed (2B)

When carried out with a nanoimprint lithography technique (2B), the step (2) may include, for example, the steps of:

(2-B1) providing a pattern formation layer on the silicon-containing film using a curable composition (hereinafter, may be also referred to as "step (2-B1)");

(2-B2) bringing a surface of a mold having a reversal pattern into close contact with the pattern formation layer (hereinafter, may be also referred to as "step (2-B2)");

(2-B3) exposing or heating the pattern formation layer while the mold is brought into close contact (hereinafter, may be also referred to as "step (2-B3)"); and (2-B4) releasing the mold from the exposed or heated pattern formation layer (hereinafter, may be also referred to as "step (2-B4)").

Step (2-B1)

In the step (2-B1), the pattern formation layer is provided on the silicon-containing film using a curable composition. The curable composition is exemplified by a composition containing a polymerizable monomer or a polymerizable oligomer, and examples include radiation-sensitive curable compositions, thermosetting curable compositions, and the like. The curable composition may contain a curing accelerator and the like. Examples of the curing accelerator include radiation-sensitive curing accelerators such as a photoacid generating agent, a photobase generating agent, and a photosensitizer; thermal curing accelerators such as a thermal acid generating agent and a thermal base generating agent, and the like. The curing accelerators may be used in combination of two or more thereof.

The method of coating the curable composition is not particularly limited, and for example, an ink jet method, a dip coating method, an air knife coating method, a curtain coating method, a wire bar coating method, a gravure coating method, an extrusion coating method, a spin coating method, a slit scanning method, and the like.

Step (2-B2)

In the step (2-B2), a surface of a mold having a reversal pattern is brought into close contact with the pattern formation layer. The surface of the mold has a reversal pattern of the shape of the resist pattern to be formed. Examples of the material of the mold include glass, quartz, optically transparent resins such as PMMA and polycarbonate; transparent metal vapor deposition films; soft films of polydimethylsiloxane or the like; photocured films; metal films, and the like. When a radiation-sensitive curable composition is used as the curable composition, a material that transmits radioactive rays is used as a mold.

The pressure applied when the mold is brought into close contact is usually 0.1 MPa to 100 MPa, preferably 0.1 MPa to 50 MPa, and more preferably 0.1 MPa to 30 MPa. The time period of bringing into close contact is usually 1 second to 600 seconds, preferably 1 second to 300 seconds, and more preferably 1 second to 180 seconds.

It is to be noted that the surface of the mold is preferably subjected to a hydrophobilization treatment using a release agent or the like prior to bringing into close contact. Examples of the release agent include silicon release agents, fluorine release agents, polyethylene release agents, polypropylene release agents, paraffin release agents, montan release agents, carnauba release agents, and the like. It is to be noted that the release agent may be used either alone, or two or more thereof may be used in combination. Among these, silicon release agents are preferred. Examples of the silicon release agent include polydimethylsiloxane, acrylsilicone graft polymer, acrylsiloxane, arylsiloxane, and the like.

Step (2-B3)

In the step (2-B3), the pattern formation layer is exposed or heated while the mold is brought into contact. When a radiation-sensitive curable composition is used as the curable composition, exposure is carried out, whereas when a thermosetting composition is used, heating is carried out. Conditions of the exposure and heating may be appropriately selected according to the formulation of the curable composition used.

Step (2-B4)

In the step (2-B4), the mold is released from the exposed or heated pattern formation layer. The method of the release is not particularly limited, and for example, it may be released by: moving the mold while the pattern formation layer is fixed; moving the pattern formation layer while the mold is fixed; or moving both the mold and the pattern formation layer in opposite directions.

(2C) Method in which a Directed Self-Assembly Composition is Used

When carried out using a directed self-assembly composition (2C), the step (2) may include, for example, the steps of:

(2-C1) providing a directed self-assembly film having a phase separation structure on the resist underlayer film using a directed self-assembly composition for pattern formation (hereinafter, may be also referred to as "step (2-C1)"); and (2-C2) removing a part of the phase of the directed self-assembly film (hereinafter, may be also referred to as "step (2-C2)").

Step (2-C1)

In the step (2-C1), a directed self-assembly film having a phase separation structure is formed on the resist underlayer film using a directed self-assembly composition for pattern formation. Exemplary method of carries out this step may include e.g., a method in which annealing or the like is conducted after coating a directed self-assembly composition for pattern formation, and the like.

The directed self-assembly composition for pattern formation is a composition for forming a phase separation structure by way of directed self-assembly. The directed self-assembly composition for pattern formation is exemplified by a composition containing a block copolymer, a composition containing at least two types of polymer, and the like. Specific examples of the directed self-assembly composition include compositions containing a block copolymer including a polystyrene block-polymethyl methacrylate block, compositions containing polystyrene and polymethyl methacrylate, and the like.

The method of coating the directed self-assembly composition for pattern formation on the resist underlayer film may include, for example, a spin coating method, and the like.

The annealing temperature is usually 80° C. to 400° C. The annealing time is usually 30 seconds to 120 minutes.

It is to be noted that in order to attain more desirable phase separation structure to be obtained, a prepattern substantially perpendicular to the resist underlayer film, and/or other underlayer film laminated on the resist underlayer film are/is preferably formed prior to coating the directed self-assembly composition for pattern formation on the resist underlayer film.

Step (2-C2)

In the step (2-C2), a part of the phase of the directed self-assembly film is removed, whereby a resist pattern is formed.

Exemplary method of removing a part of the phase of the directed self-assembly film may involve e.g., dry-etching such as chemical dry-etching, sputter etching, and ion beam etching; wet etching carried out using an etching liquid such as an organic solvent or hydrofluoric acid, and the like.

As the method of carrying out the step (2), the method (2A) in which a resist composition is used is preferred among the foregoings. Due to a formation of the resist pattern by exposure and development using a resist composition, a pattern having a more favorable shape can be formed.

Step (3)

In the step (3), a pattern is formed on the substrate by dry-etching of the resist underlayer film and the substrate, using the resist pattern formed in the step (2) as a mask. The dry-etching may be carried out with a well-known dry-etching apparatus. The etching gas used for dry-etching can be appropriately selected depending on the elemental composition of the silicon-containing film subjected to etching, etc., and fluorine based gas such as $CHF_3$, $CF_4$, $C_2F_6$, $C_3F_8$ or $SF_6$, chlorine gas such as $Cl_2$ or $BCl_3$, oxygen gas such as $O_2$ or $O_3$, gas such as $H_2O$, $H_2$, $NH_3$, CO or $CO_2$, or inert gas such as He, $N_2$ or Ar, and the like may be used. The gas may be also used as a mixture. Fluorine gas is generally used, and a mixture including the fluorine gas with oxygen gas and inert gas is suitably used for dry-etching of the silicon-containing film. In the case in which etching is performed using the fluorine gas, use of a silicon-containing film formed from the polysiloxane composition described later enables the etching rate and processibility to be enhanced. As a result, productivity of the etching step can be improved.

Step (4)

In the step (4), the substrate to be processed is subjected to dry-etching using the silicon-containing pattern obtained in the step (3) as a mask to form a pattern on the substrate to be processed. The dry-etching in the step can be performed in a similar manner to that in the step (3). For the dry-etching using a silicon-containing pattern as a mask, oxygen gas is generally used, and a mixture of the oxygen gas and inert gas is suitably used. In the case in which the etching is performed using the oxygen gas, use of a silicon-containing pattern formed from the polysiloxane composition described later enables the etching resistance to be improved and the silicon-containing film to be thinned. As a result, a demand of further miniaturization of a pattern is satisfied.

Step (0)

In addition, in the pattern-forming method, a resist underlayer film that is an organic film can be also formed on a substrate to be processed as (0) a step prior to the step (1). When a resist underlayer film that is an organic film is provided between the substrate to be processed and the silicon-containing film in a multilayer resist process, the effects of the invention can be increased. In this case, the silicon-containing film is provided on the resist underlayer film in the step (1), and the resist underlayer film and the substrate to be processed are sequentially subjected to dry-etching in the step (4). The resist underlayer film that is an organic film can be generally provided by coating a composition for forming an organic underlayer film, and drying.

According to the pattern-forming method, a substrate formed with a predetermined pattern can be obtained by carrying out the steps (1) to (4).

Polysiloxane Composition

The polysiloxane composition of the embodiment of the present invention is suitably used as a composition for forming a resist underlayer film that forms a silicon-containing film and the like in the method for forming a pattern of the present invention, and contains (A) a polysiloxane and (B) a crosslinking accelerator. In addition, the polysiloxane composition may contain (C) a solvent as a suitable component, and further may contain other optional component within the range not to impair the effects of the present invention. Hereinafter, each component will be explained.

Polysiloxane (A)

The polysiloxane (A) is a polysiloxane containing a fluorine atom. A polysiloxane is a polymer or oligomer having a siloxane bond. The polysiloxane (A) is not particularly limited as long as it includes a fluorine atom, and a fluorine atom may bond to a silicon atom of the polysiloxane (A), or may be contained as an atom that configures an organic group that bonds to the silicon atom. The organic group is exemplified by a fluorinated hydrocarbon which may be substituted, and the like.

Examples of the fluorinated hydrocarbon group include fluorinated alkyl groups such as a fluoromethyl group, a trifluoromethyl group, a fluoroethyl group, a difluoroethyl group, a trifluoroethyl group and a pentafluoroethyl group; fluorinated alicyclic hydrocarbon groups such as a fluorocyclopentyl group, a difluorocyclopentyl group, a tetrafluorocyclopentyl group, a nonafluorocyclopentyl group, a tetrafluorocyclohexyl group, an undecafluorocyclohexyl group, a fluoronorbornyl group, a difluoronorbornyl group, a fluoroadamantyl group and a difluoroadamantyl group; fluorinated phenyl groups such as a fluorophenyl group, a difluorophenyl group, a trifluorophenyl group, a tetrafluorophenyl group and a pentafluorophenyl group; fluorinated aryl groups such as a fluorotolyl group, a pentafluorotolyl group, a trifluoromethylphenyl group and a trifluoromethyl fluorophenyl group; fluorinated aralkyl groups such as a fluorobenzyl group, a difluorobenzyl group, a trifluorobenzyl group, a tetrafluorobenzyl group, a pentafluorobenzyl group, a fluorophenylethyl group and a pentafluorophenylethyl group, and the like.

Of these, a fluorinated aryl group is preferred, a fluorinated phenyl group is more preferred, a fluorophenyl group, a difluorophenyl group, a trifluorophenyl group, a tetrafluorophenyl group and a pentafluorophenyl group are further preferred, a fluorophenyl group and a pentafluorophenyl group are particularly preferred, and a pentafluorophenyl group is further particularly preferred.

A substituent included in the fluorinated hydrocarbon group is exemplified by halogen atoms such as a chlorine atom, a bromine atom and an iodine atom, a hydroxyl group, an alkoxy group, an alkoxycarbonyl group, an alkoxycarbonyloxy group, an acyl group, an acyloxy group, a cyano group, and the like.

The polysiloxane (A) is preferably a hydrolytic condensation product of a compound that includes the silane compound represented by the above formula (1) (hereinafter, may be also referred to as "silane compound (1)"). Due to being a hydrolytic condensation product of a compound that includes the silane compound represented by the above formula (1), the polysiloxane (A) can be conveniently synthesized.

In the above formula (1), $R^1$ represents a monovalent hydrocarbon group having a fluorine atom, wherein a part or all of hydrogen atoms included in the hydrocarbon group may be substituted; $R^2$ represents a hydrogen atom or a monovalent hydrocarbon group, wherein the hydrocarbon group may be substituted with an atom or a group other than a fluorine atom; X represents a halogen atom or —$OR^3$, wherein $R^3$ represents a monovalent organic group; a is an integer of 1 to 3; b is an integer of 0 to 2, wherein the (a+b)≤3 is satisfied. Provided that the $R^1$, $R^2$ and X are each present in a plurality of number, the plurality of $R^1$s, $R^2$s and Xs may be each the same or different.

The monovalent hydrocarbon group having a fluorine atom represented by the $R^1$ is exemplified by a similar group to that exemplified as a fluorinated hydrocarbon group of the organic groups that bond to a silicon atom, and the like.

The substituent that may be included in the monovalent hydrocarbon group having a fluorine atom is exemplified by a similar group to that exemplified as a substituent may be included in the fluorinated hydrocarbon group of the organic groups that bond to a silicon atom, and the like.

As the $R^1$, a fluorinated aryl group is preferred, a fluorinated phenyl group is more preferred, a fluorophenyl group, a difluorophenyl group, a trifluorophenyl group, a tetrafluorophenyl group and a pentafluorophenyl group are further preferred, a fluorophenyl group and a pentafluorophenyl group are particularly preferred, and a pentafluorophenyl group is further particularly preferred among these.

Examples of the monovalent hydrocarbon group represented by the $R^2$ include an alkyl group, an alkenyl group, an aryl group, and the like.

Examples of the alkyl group include linear alkyl groups such as a methyl group, an ethyl group, an n-propyl group, an n-butyl group and an n-pentyl group; and branched chain-like alkyl groups such as an isopropyl group, an isobutyl group, a sec-butyl group, a t-butyl group and an isoamyl group, and the like.

Examples of the alkenyl group include a group obtained by removing one hydrogen atom from an alkene compound, such as an ethenyl group, a 1-propen-1-yl group, a 1-propen-2-yl group, a 1-propen-3-yl group, a 1-buten-1-yl group, a 1-buten-2-yl group, a 1-buten-3-yl group, a 1-buten-4-yl group, a 2-buten-1-yl group, a 2-buten-2-yl group, a 1-penten-5-yl group, a 2-penten-1-yl group, a 2-penten-2-yl group, a 1-hexen-6-yl group, a 2-hexen-1-yl group, a 2-hexen-2-yl group, and the like.

Examples of the aryl group include a phenyl group, a naphthyl group, a tolyl group, a xylyl group, a mesityl group, and the like.

Examples of the substituent other than a fluorine atom which may be included in the hydrocarbon group include a similar group to the exemplified substituent that may be included in the fluorinated hydrocarbon group of the organic groups that bond to a silicon atom, and the like.

The halogen atom represented by X is exemplified by a fluorine atom, a chlorine atom, a bromine atom, an iodine atom, and the like.

The monovalent organic group represented by $R^3$ of —$OR^3$ as the X is exemplified by an alkyl group, an alkylcarbonyl group, and the like. The alkyl group is preferably a methyl group, an ethyl group, an n-propyl group, an isopropyl group, an n-butyl group, an isobutyl group, a sec-butyl group and a t-butyl group, more preferably a methyl group and an ethyl group, and further preferably a methyl group. In addition, the alkylcarbonyl group is preferably a methylcarbonyl group and an ethylcarbonyl group, and more preferably a methylcarbonyl group.

X represents preferably —$OR^3$, more preferably an alkoxy group, yet more preferably a methoxy group or an ethoxy group, and particularly preferably a methoxy group.

"a" is preferably 1 or 2, and more preferably 1. "b" is preferably an integer of 0 to 2, more preferably 0 or 1, and further preferably 0. The (a+b) is preferably an integer of 1 to 3, more preferably 1 or 2, and further preferably 1.

The silane compound (1) is exemplified by compounds represented by the following formulae, and the like.

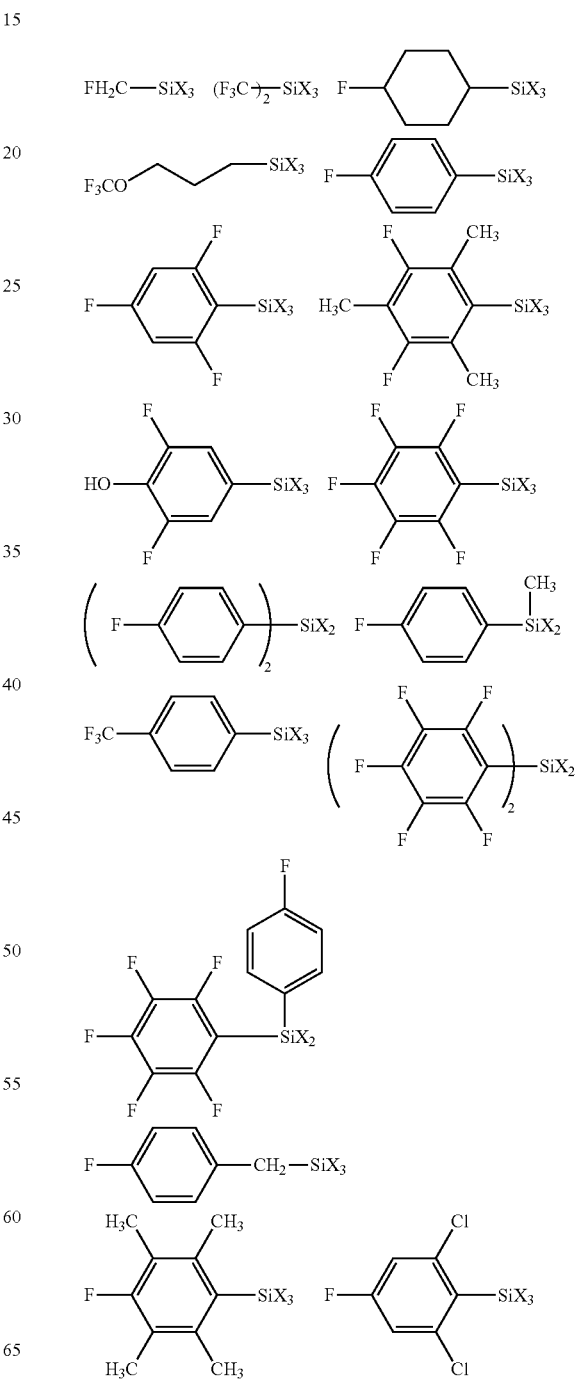

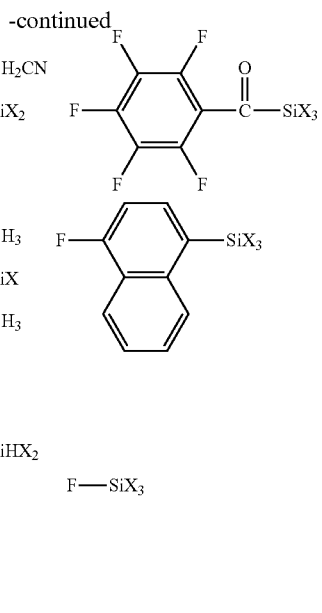

In the above formulae, X is as defined in the above formula (1).

Of these, a silane compound that includes a fluorinated aryl group is preferred, a silane compound that includes a fluorinated phenyl group is more preferred, fluorophenyltrialkoxysilane and pentafluorophenyltrialkoxysilane are further preferred, and pentafluorophenyltrialkoxysilane is particularly preferred.

Synthesis Method of Polysiloxane (A)

The polysiloxane (A) can be synthesized by, for example, subjecting the silane compound (1) and other silane compound (A) as needed to hydrolytic condensation.

With respect to the other silane compound that may be subjected to hydrolytic condensation together with the silane compound (1), examples of a silane compound that includes one silicon atom include aromatic ring-containing trialkoxysilanes such as phenyltrimethoxysilane, benzyltrimethoxysilane, phenethyltrimethoxysilane, 4-methylphenyltrimethoxysilane, 4-ethylphenyltrimethoxysilane, 4-methoxyphenyltrimethoxysilane, 4-phenoxyphenyltrimethoxysilane, 4-hydroxyphenyltrimethoxysilane, 4-aminophenyltrimethoxysilane, 4-dimethylaminophenyltrimethoxysilane, 4-acetylaminophenyltrimethoxysilane, 3-methylphenyltrimethoxysilane, 3-ethylphenyltrimethoxysilane, 3-methoxyphenyltrimethoxysilane, 3-phenoxyphenyltrimethoxysilane, 3-hydroxyphenyltrimethoxysilane, 3-aminophenyltrimethoxysilane, 3-dimethylaminophenyltrimethoxysilane, 3-acetylaminophenyltrimethoxysilane, 2-methylphenyltrimethoxysilane, 2-ethylphenyltrimethoxysilane, 2-methoxyphenyltrimethoxysilane, 2-phenoxyphenyltrimethoxysilane, 2-hydroxyphenyltrimethoxysilane, 2-aminophenyltrimethoxysilane, 2-dimethylaminophenyltrimethoxysilane, 2-acetylaminophenyltrimethoxysilane, 2,4,6-trimethylphenyltrimethoxysilane, 4-methylbenzyltrimethoxysilane, 4-ethylbenzyltrimethoxysilane, 4-methoxybenzyltrimethoxysilane, 4-phenoxybenzyltrimethoxysilane, 4-hydroxybenzyltrimethoxysilane, 4-aminobenzyltrimethoxysilane, 4-dimethylaminobenzyltrimethoxysilane, and 4-acetylaminobenzyltrimethoxysilane; alkyltrialkoxysilanes such as methyltrimethoxysilane, methyltriethoxysilane, methyltri-n-propoxysilane, methyltriisopropoxysilane, methyltri-n-butoxysilane, methyltri-sec-butoxysilane, methyltri-t-butoxysilane, methyltriphenoxysilane, methyltriacetoxysilane, methyltrichlorosilane, methyltriisopropenoxysilane, methyltris(dimethylsiloxy)silane, methyltris(methoxyethoxy)silane, methyltris(methylethylketoxime)silane, methyltris(trimethylsiloxy)silane, methylsilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-t-butoxysilane, ethyltriphenoxysilane, ethylbistris(t-rimethylsiloxy)silane, ethyldichlorosilane, ethyltriacetoxysilane, ethyltrichlorosilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-t-butoxysilane, n-propyltriphenoxysilane, n-propyltriacetoxysilane, n-propyltrichlorosilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-t-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-t-butoxysilane, n-butyltriphenoxysilane, n-butyltrichlorosilane, 2-methylpropyltrimethoxysilane, 2-methylpropyltriethoxysilane, 2-methylpropyltri-n-propoxysilane, 2-methylpropyltriisopropoxysilane, 2-methylpropyltri-n-butoxysilane, 2-methylpropyl-tri-sec-butoxysilane, 2-methylpropyltri-t-butoxysilane, 2-methylpropyltriphenoxysilane, 1-methylpropyltrimethoxysilane, 1-methylpropyltriethoxysilane, 1-methylpropyltri-n-propoxysilane, 1-methylpropyltriisopropoxysilane, 1-methylpropyltri-n-butoxysilane, 1-methylpropyltri-sec-butoxysilane, 1-methylpropyltri-t-butoxysilane, 1-methylpropyltriphenoxysilane, t-butyltrimethoxysilane, t-butyltriethoxysilane, t-butyltri-n-propoxysilane, t-butyltriisopropoxysilane, t-butyltri-n-butoxysilane, t-butyltri-sec-butoxysilane, t-butyltri-t-butoxysilane, t-butyltriphenoxysilane, t-butyltrichlorosilane, and t-butyldichlorosilane;

alkenyltrialkoxysilanes such as vinyltrimethoxysilane, vinyltriethoxysilane, vinyltri-n-propoxysilane, vinyltriisopropoxysilane, vinyltri-n-butoxysilane, vinyltri-sec-butoxysilane, vinyltri-t-butoxysilane, vinyltriphenoxysilane, allyltrimethoxysilane, allyltriethoxysilane, allyltri-n-propoxysilane, allyltriisopropoxysilane, allyltri-n-butoxysilane, allyltri-sec-butoxysilane, allyltri-t-butoxysilane, and allyltriphenoxysilane;

tetraalkoxysilanes such as tetramethoxysilane, tetraethoxysilane, tetra-n-propoxysilane, tetraisopropoxysilane, tetra-n-butoxysilane, tetra-sec-butoxysilane, and tetra-t-butoxysilane;

tetraarylsilanes such as tetraphenoxysilane; epoxy group-containing silanes such as oxetanyltrimethoxysilane, oxiranyltrimethoxysilane, oxiranylmethyltrimethoxysilane, and 3-glycidyloxypropyltrimethoxysilane;

tetrahalosilanes such as tetrachlorosilane; and the like.

In addition, examples of other silane compound that includes two or more silicon atoms include disilanes such as hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,2,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, 1,2-diphenoxy-1,1,2,2-tetraphenyldisilane; bis(trimethoxysilyl)methane, bis(triethoxysilyl)methane, bis(tri-n-propoxysilyl)methane, bis(tri-isopropoxysilyl)methane, bis(tri-n-butoxysilyl)methane, bis(tri-sec-butoxysilyl)methane, bis(tri-t-butoxysilyl)methane, 1,2-bis(trimethoxysilyl)ethane, 1,2-bis(triethoxysilyl)ethane, 1,2-bis(tri-n-propoxysilyl)ethane, 1,2-bis(tri-isopropoxysilyl)ethane, 1,2-bis(tri-n-butoxysilyl)ethane, 1,2-bis(tri-sec-butoxysilyl)ethane, 1,2-bis(tri-t-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(di-isopropoxymethylsilyl)-1-(tri-isopropoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-t-butoxymethylsilyl)-1-(tri-t-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(di-isopropoxymethylsilyl)-2-(tri-isopropoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-t-butoxymethylsilyl)-2-(tri-t-butoxysilyl)ethane, bis(dimethoxymethylsilyl)methane, bis(diethoxymethylsilyl)methane, bis(di-n-propoxymethylsilyl)methane, bis(di-isopropoxymethylsilyl)methane, bis(di-n-butoxymethylsilyl)methane, bis(di-sec-butoxymethylsilyl)methane, bis(di-t-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(di-isopropoxymethylsilyl)ethane, 1,2-bis(di-n-butoxymethylsilyl) ethane, 1,2-bis(di-sec-butoxymethylsilyl)ethane, 1,2-bis(di-t-butoxymethylsilyl)ethane, bis(dimethylmethoxysilyl)methane, bis(dimethylethoxysilyl)methane, bis(dimethyl-n-propoxysilyl)methane, bis(dimethyl-isopropoxysilyl)methane, bis(dimethyl-n-butoxysilyl)methane, bis(dimethyl-sec-butoxysilyl)methane, bis(dimethyl-t-butoxysilyl)methane, 1,2-bis(dimethylmethoxysilyl)ethane, 1,2-bis(dimethylethoxysilyl)ethane, 1,2-bis(dimethyl-n-propoxysilyl)ethane, 1,2-bis(dimethyl-isopropoxysilyl)ethane, 1,2-bis(dimethyl-n-butoxysilyl)ethane, 1,2-bis(dimethyl-sec-butoxysilyl)ethane, 1,2-bis(dimethyl-t-butoxysilyl)ethane, 1-(dimethoxymethylsilyl)-1-(trimethylsilyl)methane, 1-(diethoxymethylsilyl)-1-(trimethylsilyl)methane, 1-(di-n-propoxymethylsilyl)-1-(trimethylsilyl)methane, 1-(di-isopropoxymethylsilyl)-1-(trimethylsilyl)methane, 1-(di-n-butoxymethylsilyl)-1-(trimethylsilyl)methane, 1-(di-sec-butoxymethylsilyl)-1-(trimethylsilyl)methane, 1-(di-t-butoxymethylsilyl)-1-(trimethylsilyl)methane, 1-(dimethoxymethylsilyl)-2-(trimethylsilyl)ethane, 1-(diethoxymethylsilyl)-2-(trimethylsilyl)ethane, 1-(di-n-propoxymethylsilyl)-2-(trimethylsilyl)ethane, 1-(di-isopropoxymethylsilyl)-2-(trimethylsilyl)ethane, 1-(di-n-butoxymethylsilyl)-2-(trimethylsilyl)ethane, 1-(di-sec-butoxymethylsilyl)-2-(trimethylsilyl)ethane, 1-(di-t-butoxymethylsilyl)-2-(trimethylsilyl)ethane, 1,2-bis(trimethoxysilyl)benzene, 1,2-bis(triethoxysilyl)benzene, 1,2-bis(tri-n-propoxysilyl)benzene, 1,2-bis(tri-isopropoxysilyl)benzene, 1,2-bis(tri-n-butoxysilyl)benzene, 1,2-bis(tri-sec-butoxysilyl)benzene, 1,2-bis(tri-t-butoxysilyl)benzene, 1,3-bis(trimethoxysilyl)benzene, 1,3-bis(triethoxysilyl)benzene, 1,3-bis(tri-n-propoxysilyl)benzene, 1,3-bis(tri-isopropoxysilyl)benzene, 1,3-bis(tri-n-butoxysilyl)benzene, 1,3-bis(tri-sec-butoxysilyl)benzene, 1,3-bis(tri-t-butoxysilyl)benzene, 1,4-bis(trimethoxysilyl)benzene, 1,4-bis(triethoxysilyl)benzene, 1,4-bis(tri-n-propoxysilyl)benzene, 1,4-bis(tri-isopropoxysilyl)benzene, 1,4-bis(tri-n-butoxysilyl)benzene, 1,4-bis(tri-sec-butoxysilyl)benzene, 1,4-bis(tri-t-butoxysilyl)benzene, and the like.

Polycarbosilanes such as polydimethoxymethylcarbosilane and polydiethoxymethylcarbosilane, and the like may further be used.

Conditions in the hydrolytic condensation of the silane compound (1) and other silane compound are not particularly limited, and the hydrolytic condensation can be carried out as one example described below.

The water used for the hydrolytic condensation is preferably purified by methods such as a treatment with a reverse osmosis membrane, an ion exchange treatment and a distillation. Due to use of such purified water, side reactions can be inhibited, thereby enabling a reactivity of the hydrolysis to be improved. The amount of the water used is preferably 0.1 to 3 mol, more preferably 0.3 to 2 mol, and further preferably 0.5 to 1.5 mol based on 1 mol of the total amount of a hydrolyzable group of a silane compound (i.e., a group represented by X in the above formula (1)). Use of water having such an amount enables the reaction rate of the hydrolytic condensation to be optimized.

The reaction solvent capable of being used for the hydrolytic condensation is not particularly limited, and generally the reaction solvent similar to that used for preparation of the composition for forming an underlayer film described later may be used. Examples of the reaction solvent include ethylene glycol monoalkyl ether acetate, diethylene glycol dialkyl ether, propylene glycol monoalkyl ether, propylene glycol monoalkyl ether acetate, propionic acid esters, and the like. Among these reaction solvents, diethylene glycol dimethyl ether, diethylene glycol ethyl methyl ether, propylene glycol monomethyl ether, propylene glycol monoethyl ether, propylene glycol monomethyl ether acetate or methyl 3-methoxypropionate is preferred.

The hydrolytic condensation reaction is preferably carried out in the presence of a catalyst such as a catalyst of an acid (for example, hydrochloric acid, sulfuric acid, nitric acid, formic acid, oxalic acid, acetic acid, trifluoroacetic acid, trifluoromethanesulfonic acid, phosphoric acid, acidic ion exchange resin and various types of Lewis acid), a catalyst of a base (for example, nitrogen-containing compounds such as ammonia, primary amines, secondary amines, tertiary amines and pyridine; basic ion exchange resin; hydroxides such as sodium hydroxide; carbonates such as potassium carbonate; carboxylates such as sodium acetate; various types of Lewis base), alkoxides (for example, zirconium alkoxide, titanium alkoxide, aluminum alkoxide). The amount of the catalyst used is preferably no greater than 0.2 mol, and more preferably 0.00001 to 0.1 mol based on 1 mol of a silane compound in light of promotion of the hydrolytic condensation reaction.

The reaction temperature and the reaction time are appropriately set in the hydrolytic condensation. The reaction temperature is preferably 40 to 200° C., and more preferably 50 to 150° C. The reaction time is preferably 30 minutes to 24 hours, and more preferably 1 to 12 hours. Such a reaction temperature and a reaction time enable the hydrolytic condensation reaction to be most efficiently carried out. In the hydrolytic condensation, the hydrolytic condensation reaction may be carried out in one step by adding a silane compound, water and a catalyst in the reaction system at one time, or in a multiple step by adding a silane compound, water and a catalyst in the reaction system at several times. It is to be noted that water and generated alcohol can be removed from the reaction system by subjecting the water and the generated alcohol to evaporation after the hydrolytic condensation reaction.

The proportion of the silane compound (1) used for forming the polysiloxane (A) is preferably 1 mol % to 50 mol %, more preferably 1 mol % to 20 mol %, and further preferably 5 mol % to 15 mol % based on the number of silicon atoms of all the silane compounds used for the hydrolytic condensation. When the proportion of the silane compound (1) used is less than the lower limit, the pattern collapse resistance of the resist pattern formed may be deteriorated. When the proportion of the silane compound (1) used exceeds the upper limit, the resist pattern shape formed may be less favorable.

The polystyrene equivalent weight average molecular weight (Mw) of the polysiloxane (A) as determined by gel permeation chromatography (GPC) is typically 1,000 to 20,000, preferably 1,000 to 15,000, more preferably 1,200 to 10,000, and further preferably 1,500 to 7,000.

It is to be noted that the Mw herein is a value determined by the gel permeation chromatography (GPC) on the basis of mono-dispersion polystyrene under the analysis condition involving: a flow rate of 1.0 mL/min of; an elution solvent of tetrahydrofuran; and a column temperature of 40° C., using GPC columns (G2000HXL×2, G3000HXL×1, G4000HXL×1, manufactured by Tosoh Corporation).

The content of the polysiloxane (A) is preferably no less than 70% by mass, and more preferably no less than 80% by mass based on the total solid content of the polysiloxane composition. When the content of the polysiloxane (A) is less than 70% by mass, the etching resistance of the obtained silicon-containing film may be deteriorated.

Crosslinking Accelerator (B)

The crosslinking accelerator (B) is a compound that can promote a crosslinking reaction between molecular chains or in molecular chains of the polysiloxane (A) in providing a silicon-containing film from the polysiloxane composition, etc. The crosslinking accelerator (B) is not particularly limited as long as it has the property, and is exemplified by an acid, a base, a metal complex, a metal salt compound, an onium salt compound, and the like. The crosslinking accelerator (B) may be used either one type alone, or as a mixture of two or more thereof.

Examples of the acid include halogenated hydrogen acids such as hydrochloric acid, carboxylic acids such as nitric acid, sulfuric acid, sulfurous acid, hydrosulfuric acid, perchloric acid, hydrogen peroxide, carbonic acid, formic acid and acetic acid; sulfonic acids such as benzenesulfonic acid; phosphoric acid, heteropolyacid, inorganic solid acid, and the like.

Examples of the base include a nitrogen-containing compound; alkali metal compounds such as alkali hydroxide, alkali carbonate, and the like.

The metal complex is exemplified by a chelate complex configured with metal elements that belong to the 2nd, 4th, 5th and 13th families in the periodic table, and ligands such as β-diketone and keto ester, and the like.

The metal salt compound is exemplified by an alkali metal salt compound represented by the following formula (a), and the like.

$$M^+{}_a H^+{}_b X^{n-}{}_c \qquad (a)$$

In the above formula (a), M$^+$ represents an alkali metal ion; X$^{n-}$ represents at least one selected from the group consisting of a hydroxide ion and an organic acid ion having a valency of 1 or no less than 2 and having 1 to 30 carbon atoms; a is an integer of 1 or more; b is an integer of 0 or no less than 1; n is a valence of the hydroxide ion or the organic acid ion; and the (a+b) is identical to the total valence of c hydroxide ions and organic acid ions.

Examples of the alkali metal salt compound represented by the above formula (a) include hydroxide salts such as lithium, sodium, potassium, rubidium and cesium, monovalent salts such as formate, acetate, propionate, decanoate, stearate, benzoate and phthalate; monovalent or bivalent salts such as oxalate, malonate, succinate, glutarate, adipate, maleate, citrate and carbonate of the metals described above, and the like.

As the crosslinking accelerator (B), nitrogen-containing compounds and onium salt compounds are preferred of these in light of a possibly more effective increase of the molecular weight of a polysiloxane.

Examples of the nitrogen-containing compound include an amine compound, an amide group-containing compound, a urea compound, a nitrogen-containing heterocyclic compound, and the like.

Examples of the amine compound include mono(cyclo)alkylamines; di(cyclo)alkylamines; tri(cyclo)alkylamines; substituted alkylaniline or a derivative thereof; ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis(1-(4-aminophenyl)-1-methylethyl)benzene, 1,3-bis(1-(4-aminophenyl)-1-methylethyl)benzene, bis(2-dimethylaminoethyl)ether, bis(2-diethylaminoethyl)ether, 1-(2-hydroxyethyl)-2-imidazolidinone, 2-quinoxalinol, N,N,N',N'-tetrakis(2-hydroxypropyl)ethylene diamine, N,N,N',N''N''-pentamethyldiethylenetriamine, and the like.

Examples of the amide group-containing compound include N-t-butoxycarbonyl group-containing amino compound, N-t-amyloxycarbonyl group-containing amino compound, formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl) isocyanurate, and the like. Of these, N-t-butoxycarbonyl group-containing amino compound and N-t-amyloxycarbonyl group-containing amino compound are preferred. Of these, N-t-butoxycarbonyl-4-hydroxypiperidine, N-t-amyloxycarbonyl-4-hydroxypiperidine, N-t-butoxycarbonylpyrrolidine, N-t-butoxycarbonyl-2-hydroxymethylpyrrolidine and N-t-butoxycarbonyl-2-phenylbenzimidazole are preferred.

Examples of the urea compound include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compound include imidazoles; pyridines; piperazines; pyrazine, pyrazole, pyridazine, quinoxaline, purine, pyrrolidine, piperidine, piperidine ethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like.

As the nitrogen-containing compound, an amine compound or a compound that generates an amine compound by heating are preferred among these in light of capability of achieving an appropriate basicity.

The amine compound or the compound that generates an amine compound by heating is exemplified by (B1) a nitrogen-containing compound having at least one polar group selected from a hydroxyl group and a carboxyl group, and an ester group (hereinafter, may be also referred to as "compound (B1)"), (B2) a nitrogen-containing compound having at least one group selected from a hydroxyl group, a carboxyl group and an ether group (hereinafter, may be also referred to as "compound (B2)"), and (B3) a nitrogen-containing compound having an ester group (hereinafter, may be referred to as "compound (B3)") shown later, and the like. The ester group included in the compound (B1) and the compound (B2) is dissociated by heating to generate a compound having a basic amino group due to bonding to a nitrogen atom of the basic amino group.

The compound (B1) is exemplified by compounds represented by the following formulae (B-1-1) to (B-1-5), and the like.

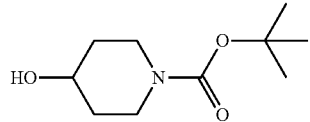
(B-1-1)

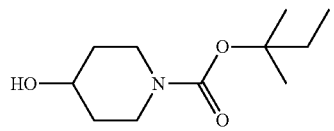
(B-1-2)

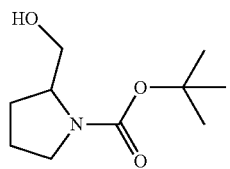
(B-1-3)

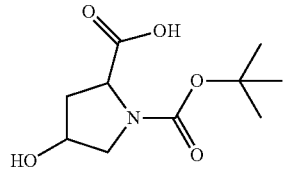
(B-1-4)

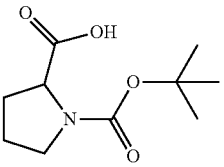
(B-1-5)

The compound (B2) is exemplified by compounds represented by the following formulae (B-2-1) to (B-2-4), and the like. In addition, the compound (B3) is exemplified by compounds represented by the following formulae (B-3-1) to (B-3-4), and the like.

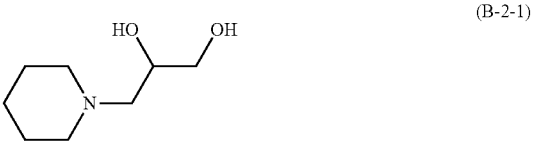
(B-2-1)

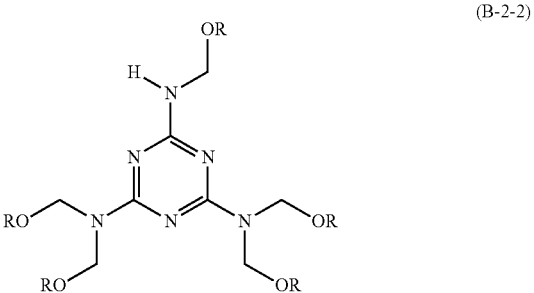
(B-2-2)

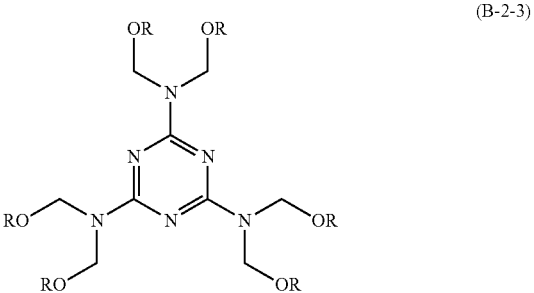
(B-2-3)

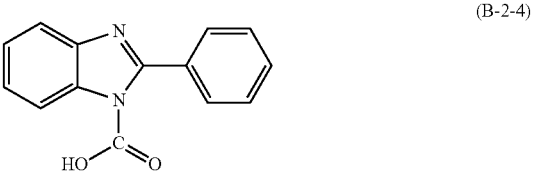
(B-2-4)

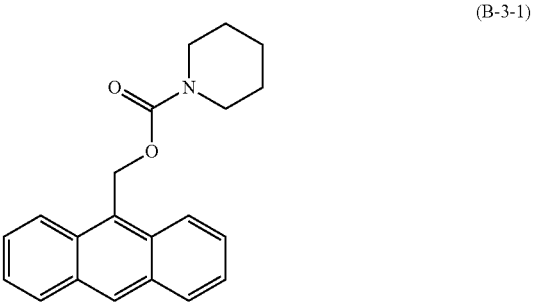
(B-3-1)

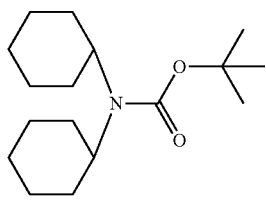

(B-3-2)

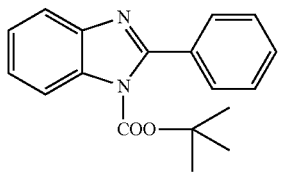

(B-3-3)

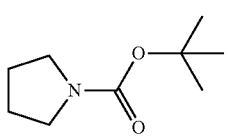

(B-3-4)

In the above formulae (B-2-2) and (B-2-3), R represents an alkyl group having 1 to 10 carbon atoms or a cycloalkyl group having 3 to 10 carbon atoms.

As the nitrogen-containing compound, the compound (B1) and the compound (B2) are preferred, and the compound represented by the above formula (B-1-1), the compounds represented by the above formula (B-1-2) and the above formula (B-1-5), and the compound represented by the above formula (B-2-1) are more preferred among these. Due to these compounds having a polar group, sublimation of the compound is suppressed upon baking for formation of the silicon-containing film, and thus the compounds can remain in the silicon-containing film, thereby enabling the effects to be sufficiently achieved.

The onium salt compound is exemplified by a compound represented by the following formula (b), and the like.

$$Q^+{}_d H^+{}_e Y^{m-}{}_f \quad (b)$$

In the above formula (b), $Q^+$ represents a monovalent onium cation; $Y^{n-}$ represents at least one selected from the group consisting of a hydroxide ion, an organic acid ion having a valency of 1 or no less than 2 and having 1 to 30 carbon atoms, and a non-nucleophilic anion having a valency of 1 or no less than 2; d is an integer of 1 or more; e is an integer of 0 or no less than 1; m is a valence of the hydroxide ion, the organic acid ion or non-nucleophilic anion; and the (d+e) is identical to the total valence of f hydroxide ions, organic acid ions and non-nucleophilic anion.

The monovalent onium cation represented by $Q^+$ is exemplified by a sulfonium cation represented by the following formula (b1), an iodonium cation represented by the following formula (b2), and an ammonium cation represented by the following formula (b3), and the like.

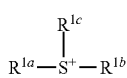

(b1)

In the above formula (b1), $R^{1a}$, $R^{1b}$ and $R^{1c}$ each independently represent an alkyl group, an alkenyl group, an oxoalkyl group or an oxoalkenyl group having 1 to 12 carbon atoms, a cycloalkyl group, a cycloalkenyl group, an oxocycloalkyl group or an oxocycloalkenyl group having 3 to 12 carbon atoms, an aryl group having 6 to 20 carbon atoms, or an aralkyl group or an aryloxoalkyl group having 7 to 20 carbon atoms. A part or all of hydrogen atoms included in these groups may be substituted. In addition, any two of $R^{1a}$, $R^{1b}$ and $R^{1c}$ may taken together represent a ring structure together with a sulfur atom to which $R^{1a}$, $R^{1b}$ and $R^{1c}$ bond.

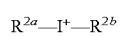

(b2)

In the above formula (b2), $R^{2a}$ and $R^{2b}$ each independently represent an alkyl group, an alkenyl group, an oxoalkyl group or an oxoalkenyl group having 1 to 12 carbon atoms, a cycloalkyl group, a cycloalkenyl group, an oxocycloalkyl group or an oxocycloalkenyl group having 3 to 12 carbon atoms, an aryl group having 6 to 20 carbon atoms, or an aralkyl group or an aryloxoalkyl group having 7 to 20 carbon atoms. A part or all of hydrogen atoms included in these groups may be substituted. In addition, $R^{2a}$ and $R^{2b}$ may taken together represent a ring structure together with a sulfur atom to which $R^{2a}$ and $R^{2b}$ bond.

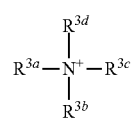

(b3)

In the above formula (b1), $R^{3a}$, $R^{3b}$, $R^{3c}$ and $R^{3d}$ each independently represent a hydrogen atom, an alkyl group, an alkenyl group, an oxoalkyl group or an oxoalkenyl group having 1 to 12 carbon atoms, a cycloalkyl group, a cycloalkenyl group, an oxocycloalkyl group or an oxocycloalkenyl group having 3 to 12 carbon atoms, an aryl group having 6 to 20 carbon atoms, or an aralkyl group or an aryloxoalkyl group having 7 to 20 carbon atoms. A part or all of hydrogen atoms included in these groups may be substituted. In addition, any two or more of $R^{3a}$, $R^{3b}$, $R^{3c}$ and $R^{3d}$ may taken together represent a ring structure together with a sulfur atom to which $R^{3a}$, $R^{3b}$, $R^{3c}$ and $R^{3d}$ bond.

Examples of the alkyl group include a methyl group, an ethyl group, an n-propyl group, an i-propyl group, an n-butyl group, an i-butyl group, a sec-butyl group, a t-butyl group, and the like.

Examples of the alkenyl group include an ethenyl group, a propenyl group, and the like.

Examples of the oxoalkyl group include a 2-oxopropyl group, a 2-oxobutyl group, and the like.

Examples of the oxoalkenyl group include a 4-oxo-2-pentenyl group, a 4-oxo-2-hexenyl group, and the like.

Examples of the cycloalkyl group include a cyclopentyl group, a cyclohexyl group, a cyclohexylmethyl group, a norbornyl group, an adamantyl group, and the like.

Examples of the cycloalkenyl group include a cyclopentenyl group, a cyclohexenyl group, a cyclohexenyl methyl group, a norbornenyl group, and the like.

Examples of the oxocycloalkyl group include a 2-oxocyclopentyl group, a 2-oxocyclohexyl group, and the like.

Examples of the oxocycloalkenyl group include a 2-oxo-4-cyclopentyl group, a 2-oxo-5-cyclohexenyl group, and the like.

Examples of the aryl group include a phenyl group, a tolyl group, a xylyl group, a mesityl group, a naphthyl group, a methylnaphthyl group, an anthryl group, and the like.

Examples of the aralkyl group include a benzyl group, a naphthylmethyl group, and the like.

Examples of the aryloxoalkyl group include a 2-phenyl-2-oxoethyl group, a 2-naphthyl-2-oxoethyl group, and the like.

Examples of the substituent that may substitute for a hydrogen atom of the groups described above include halogen atoms such as a fluorine atom, a chlorine atom, a bromine atom, an iodine atom, an alkoxy group, an acyl group, an acyloxy group, an alkoxycarbonyl group, an alkoxycarbonylmethyl group, a hydroxy group, a carboxy group, a cyano group, a nitro group, and the like.

The monovalent onium cation is preferably a sulfonium cation, an iodonium cation and an ammonium cation, more preferably a substituted or unsubstituted triarylsulfonium cation and a quaternary ammonium cation, further preferably a triarylsulfonium cation and a tetraalkylammonium cation, and particularly preferably a triphenylsulfonium cation and a tetramethylammonium cation.

In addition, the monovalent onium cation is also preferably a photodegradable cation that is degraded by light such as an ultraviolet ray and a far ultraviolet ray among the sulfonium cation, the iodonium cation, and the like.

Examples of the organic acid ion represented by $Y^{n-}$ include monovalent ions such as a formate ion, an acetate ion, a propionate ion, a decanate ion, a stearate ion, a benzoate ion and a phthalate ion; monovalent or bivalent ions such as an oxalate ion, a malonate ion, a succinate ion, a glutarate ion, an adipate ion, a malate ion, a citrate ion, a carbonate ion, and the like.

Of these, a monovalent ion is preferred, and an acetate ion and a monovalent malate ion are more preferred.

Examples of the non-nucleophilic anion represented by $Y^{n-}$ include monovalent ions such as a fluoride ion, a chloride ion, a bromide ion, an iodide ion, a nitrate ion, a chlorate ion, a perchlorate ion, a bromate ion and an iodinate ion; ions having a valency of no less than 2 such as a sulfate ion and a phosphate ion, and the like.

Of these, a monovalent ion is preferred, and a chloride ion and a nitrate ion are preferred.

The onium salt compound is preferably a sulfonium salt compound and an ammonium salt compound, more preferably a triarylsulfonium salt compound and a tetraalkylammonium salt compound, further preferably a triphenylsulfonium salt compound and a tetramethylammonium salt compound, and particularly preferably triphenylsulfonium acetate, triphenylsulfonium hydroxide, triphenylsulfonium chloride, mono(triphenylsulfonium) malate, triphenylsulfonium nitrate and tetramethylammonium acetate.

The crosslinking accelerator (B) may be used either one type alone, or two or more types in combination. The content of the crosslinking accelerator (B) in the polysiloxane composition is typically no greater than 20 parts by mass, preferably 0.01 parts by mass to 10 parts by mass, more preferably 0.05 parts by mass to 6 parts by mass, further preferably 0.2 parts by mass to 5 parts by mass, and particularly preferably 0.5 parts by mass to 4 parts by mass with respect to 100 parts by mass of the polysiloxane (A) in light of an appropriate increase of the molecular weight by a crosslinking of the polysiloxane (A).

Solvent (C)

The polysiloxane composition generally contains (C) a solvent. The solvent (C) can be used without particular limitations as long as it can dissolve or disperse the polysiloxane (A), the crosslinking accelerator (B) and an optional component to be added as needed. The solvent (C) is exemplified by organic solvents such as an alcohol solvent, an ether solvent, a ketone organic solvent, an amide solvent, an ester organic solvent and a hydrocarbon solvent, and the like.

Examples of the alcohol solvent include monoalcohol solvents such as methanol, ethanol, n-propanol, iso-propanol, n-butanol, iso-butanol, sec-butanol, t-butanol, n-pentanol, iso-pentanol, 2-methylbutanol, sec-pentanol, t-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethyl nonyl alcohol, sec-tetradecyl alcohol, sec-heptadecyl alcohol, furfuryl alcohol, phenol, cyclohexanol, methylcyclohexanol, 3,3,5-trimethyl cyclohexanol, benzyl alcohol and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

partially etherified polyhydric alcohol solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, and the like.

Examples of the ether solvent include dialiphatic ether solvents such as diethyl ether, ethylpropyl ether, dipropyl ether, dibutyl ether and diisopropyl ether;

aromatic ether-containing solvents such as anisole, phenylethyl ether, phenylpropyl ether, tolylmethyl ether, tolylethyl ether, diphenyl ether and ditolyl ether;

cyclic ether solvents such as tetrahydrofuran, tetrahydropyran and methyltetrahydrofuran, and the like.

Examples of the ketone solvent include chain-like ketone solvents such as acetone, methyl ethyl ketone, methyl-n-propyl ketone, methyl-n-butyl ketone, diethyl ketone, methyl-iso-butyl ketone, methyl-n-pentyl ketone, ethyl-n-butyl ketone, methyl-n-hexyl ketone, di-iso-butyl ketone and trimethyl nonanone;

cyclic ketone solvents such as cyclopentanone, cyclohexanone, cycloheptanone, cyclooctanone and methylcyclohexanone; diketone solvents such as 2,4-pentanedione and acetonyl acetone;

hydroxyl group-containing ketone solvents such as diacetone alcohol;

aromatic ketone solvents such as acetophenone and phenylethyl ketone, and the like.

Examples of the amide solvent include N,N'-dimethylimidazolidinone, N-methylformamide, N,N-dimethyl formamide, N,N-diethylformamide, acetamide, N-methylacetamide, N,N-dimethylacetamide, N-methylpropionamide, N-methylpyrrolidone, and the like.

Examples of the ester solvent include carboxylic acid ester solvents such as methyl acetate, ethyl acetate, n-propyl acetate, iso-propyl acetate, n-butyl acetate, iso-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, diglycol acetate, methoxytriglycol acetate, acetomethyl acetate, acetoethyl acetate, ethyl propionate, n-butyl propionate, iso-amyl propionate, diethyl oxalate, di-n-butyl oxalate, methyl lactate, ethyl lactate, n-butyl lactate, n-amyl lactate, diethyl malonate, dimethyl phthalate and diethyl phthalate; polyhydric alcohol monoalkyl ether acetate solvents such as ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate and dipropylene glycol monoethyl ether acetate; carbonate solvents such as diethyl carbonate and propylene carbonate;

lactone solvents such as γ-butyrolactone and γ-valerolactone, and the like.

Examples of the hydrocarbon solvent include aliphatic hydrocarbon solvents such as n-pentane, iso-pentane, n-hexane, iso-hexane, n-heptane, iso-heptane, 2,2,4-trimethyl pentane, n-octane, iso-octane, cyclohexane and methylcyclohexane; aromatic hydrocarbon solvents such as benzene, toluene, xylene, mesitylene, ethylbenzene, trimethylbenzene, methylethylbenzene, n-propylbenzene, iso-propylbenzene, diethylbenzene, iso-butylbenzene, triethylbenzene, di-iso-propylbenzene and n-amylnaphthalene;

halogen-containing solvents such as dichloromethane, chloroform, chlorofluorocarbon, chlorobenzene and dichlorobenzene, and the like.

Of these organic solvents (C), alcohol solvents and ester solvents are preferred; partially etherified polyhydric alcohol solvents and polyhydric alcohol monoalkyl ether acetate solvents are more preferred, and propylene glycol monoethyl ether and propylene glycol monomethyl ether acetate are further preferred. The organic solvent (C) may be used either one type alone, or two or more types thereof may be used in combination.

The polysiloxane composition may contain water. Due to containing the water, the polysiloxane (A) is hydrated, thereby resulting in an improvement of storage stability of the polysiloxane composition. In addition, due to containing the water, curing of the silicon-containing film during providing the film is promoted, whereby a minute film can be obtained. The proportion of the water in the polysiloxane composition contained is preferably 0% by mass to 30% by mass, more preferably 0.1% by mass to 20% by mass, and further preferably 0.2% by mass to 15% by mass. When the proportion of the water contained in the polysiloxane composition exceeds the upper limit, the storage stability of the composition for forming a resist underlayer film may be deteriorated, and further uniformity of a coating film may be deteriorated.

Other Optional Components

The polysiloxane composition may further contain an acid generating agent, a base generating agent, a surfactant, β-diketone, colloidal silica, colloidal alumina, an organic polymer, or the like as other optional component in addition to the components described above.

Preparation Method of Polysiloxane Composition

The polysiloxane composition is obtained by, for example, mixing the polysiloxane (A), the crosslinking accelerator (B), and other optional component as needed, and dissolving or dispersing in the solvent (C). The solid content concentration of the polysiloxane composition is typically 0.5% by mass to 20% by mass, preferably 1% by mass to 15% by mass, and more preferably 1% by mass to 10% by mass.

EXAMPLES

Hereinafter, the present invention will be specifically explained by way of Examples, but the present invention is not limited thereto. Measuring methods of various types of physical property values are shown below.

Solid Content Concentration

The solid content concentration (% by mass) of a solution that includes a polysiloxane was calculated by determining the remaining mass after baking 0.5 g of the solution that includes a polysiloxane at 250° C. for 30 minutes.

Weight Average Molecular Weight (Mw)

The weight average molecular weight (Mw) was determined by gel permeation chromatography using GPC columns (G2000HXL: two columns; G3000HXL: one column; and G4000HXL: one column, manufactured by Tosoh Corporation) under an analytical condition including a flow rate of 1.0 mL/min and a column temperature of 40° C. with tetrahydrofuran as an elution solvent, using mono-dispersed polystyrene as a standard.

Synthesis of Polysiloxane (A)

Monomers used for synthesis of the polysiloxane (A) are shown below.

Each structural formula is shown below.

Compound (M-1): tetramethoxysilane
Compound (M-2): methyltrimethoxysilane
Compound (M-3): phenyltrimethoxysilane
Compound (M-4): 4-tolyltrimethoxysilane
Compound (M-5): 4-fluorotrimethoxysilane
Compound (M-6): pentafluorotrimethoxysilane

(M-1)

(M-2)

(M-3)

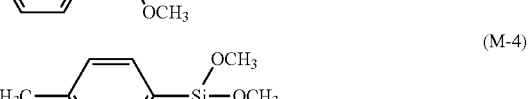

(M-4)

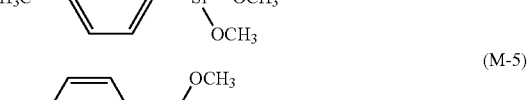

(M-5)

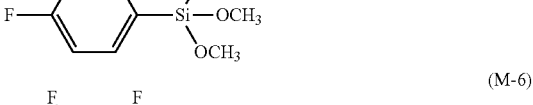

(M-6)

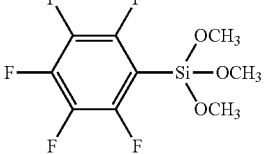

Synthesis Example 1

Synthesis of Polysiloxane (A-1)

1.27 g of oxalic acid was dissolved in 12.72 g of water with heating to prepare an aqueous oxalic acid solution. A flask charged with 22.38 g of the compound (M-1), 3.76 g of the compound (M-2), 1.99 g of the compound (M-5) and 58.04 g of propylene glycol monoethyl ether was fitted with a condenser and a dropping funnel containing the prepared aqueous oxalic acid solution. Next, after heating the mixture to 60° C. using an oil bath, the aqueous oxalic acid solution was slowly added dropwise to the mixture over 10 minutes, and thereafter the mixture was reacted at 60° C. for 4 hours. After completion of the reaction, the flask containing the reaction solution was allowed to cool, and then fitted with an evaporator. Methanol generated during the reaction was removed to obtain 75.0 g of a solution that includes (A-1) a polysiloxane. The solid content concentration of the solution containing the polysiloxane (A-1) was 18.0% by mass. In addition, the Mw of the polysiloxane (A-1) was 2,100.

Synthesis Example 2

Synthesis of Polysiloxane (A-2)

2.92 g of tetramethylammoniumhydroxide (TMAH) was dissolved in 8.75 g of water with heating to prepare an aqueous TMAH solution. Thereafter, a flask charged with 14.59 g of the prepared aqueous TMAH solution, 4.53 g of water, 40 g of methanol was fitted with a condenser and a dropping funnel containing a monomer solution obtained by dissolving 10.66 g of the compound (M-1), 3.45 g of the compound (M-2) and 1.08 g of the compound (M-5) in 50 g of methanol. Next, after heating the mixture to 50° C. using an oil bath, the monomer solution was slowly added dropwise to the mixture over 30 minutes, and thereafter the mixture was reacted at 50° C. for 2 hours. After completion of the reaction, the flask containing the reaction solution was allowed to cool. Thereafter, the reaction solution was added dropwise to 45.83 g of a maleic acid solution prepared by dissolving 5.49 g of maleic anhydride in a mixed liquid of 20.17 g of water and 20.17 g of methanol, and the mixture was stirred for 30 minutes. Next, 50 g of 4-methyl-2-pentenone was added, and then water and methanol were distilled to obtain a fitted with an evaporator. Methanol generated during the reaction was distilled to obtain 75.0 g of a solution that includes a product, 4-methyl-2-pentenone solution. The obtained product solution was moved to a separatory funnel, and then 80 g of water was added to carry out first washing with the water, followed by adding 40 g of water to carry out second washing with the water. The washed product solution was moved from the separatory funnel to a flask, and then 50 g of propylene glycol monoethyl ether was added. Thereafter, 4-methyl-2-pentenone was distilled using the evaporator to obtain 51 g of a solution containing (A-2) a polysiloxane. The solid content concentration of the solution containing the polysiloxane (A-2) was 18.0% by mass. In addition, the Mw of the polysiloxane (A-2) was 4,000.

Synthesis Examples 3 to 5

Synthesis of Polysiloxane (A-3), and Polysiloxanes (a-1) and (a-2)

Solutions containing (A-3) a polysiloxane, and (a-1) a polysiloxane and (a-2) a polysiloxane, respectively, were synthesized in a similar manner to Synthesis Example 1 except that each monomer having types shown in Table 1 below was used.

Synthesis Example 6

Synthesis of Polysiloxane (a-3)

A solution containing (a-3) a polysiloxane was synthesized in a similar manner to Synthesis Example 2 except that each monomer having types shown in Table 1 below was used.

The solid content concentration of the solutions containing the each obtained polysiloxane and the Mw of each polysiloxane are shown in Table 1.

TABLE 1

| | | Monomer | | | Physical property value |
|---|---|---|---|---|---|
| | (A) Polysiloxane | Type | Amount used (% by mol) | Mw | Solid content concentration (% by mass) |
| Synthesis Example 1 | A-1 | M-1<br>M-2<br>M-5 | 70<br>25<br>5 | 2,100 | 18 |
| Synthesis Example 2 | A-2 | M-1<br>M-2<br>M-5 | 70<br>25<br>5 | 4,000 | 18 |
| Synthesis Example 3 | A-3 | M-1<br>M-2<br>M-6 | 70<br>25<br>5 | 1,800 | 18 |
| Synthesis Example 4 | a-1 | M-1<br>M-2<br>M-3 | 70<br>25<br>5 | 2,200 | 18 |
| Synthesis Example 5 | a-2 | M-1<br>M-2<br>M-4 | 70<br>25<br>5 | 2,000 | 18 |
| Synthesis Example 6 | a-3 | M-1<br>M-2<br>M-3 | 70<br>25<br>5 | 4,100 | 18 |

Preparation of Polysiloxane Composition

Components that configure the polysiloxane composition other than the polysiloxane (A) are shown below.

Crosslinking Accelerator (B)

Structure formula of each compound is shown below.

B-1: N-t-amyloxycarbonyl-4-hydroxypiperidine
B-2: N-t-butoxycarbonyl-4-hydroxypiperidine
B-3: N-t-butoxycarbonyl-2-carboxypyrrolidine
B-4: N-(2,3-dihydroxypropyl)piperidine
B-5: triphenylsulfonium acetate
B-6: triphenylsulfonium hydroxide
B-7: tetramethylammonium acetate

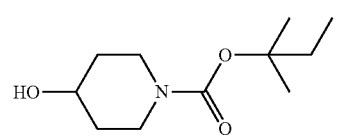

(B-1)

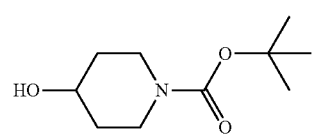

(B-2)

(B-3)

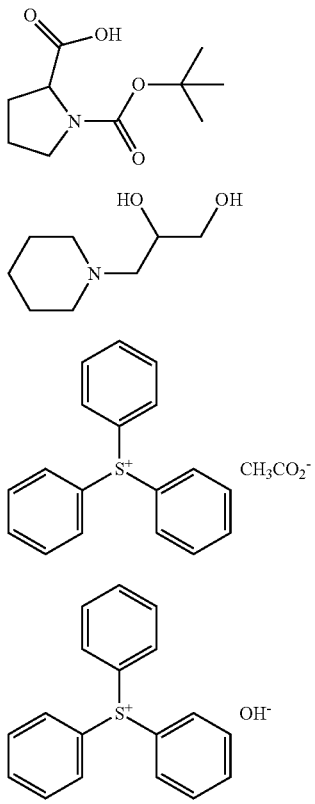

(B-4)

(B-5)

(B-6)

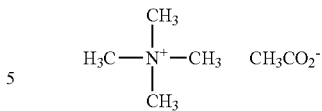

(B-7)

Solvent (C)
C-1: propylene glycol monomethyl ether acetate
C-2: propylene glycol monoethyl ether
C-3: propylene glycol monopropyl ether Example 1

A solution containing the polysiloxane (A-1) as the polysiloxane (A) in an amount of 9.70 parts by mass and the crosslinking accelerator (B-1) as the crosslinking accelerator (B) in an amount of 0.05 parts by mass were dissolved in 68.74 parts by mass of the solvent (C-1) and 21.51 parts by mass of the solvent (C-2) as the solvent (C). The resulting solution was filtered through a membrane filter with a pore size of 0.2 μm to obtain (P-1) a polysiloxane composition.

Examples 2 to 9 and Comparative Examples 1 to 4

Polysiloxane compositions (P-2) to (P-9) and (p-1) to (p-4) were obtained in a similar manner to Example 1 except that each component having types and amounts blended shown in Table 2 below was used. It is to be noted that "–" in Table 2 denotes that the corresponding component was not used.

TABLE 2

|  | Polysiloxane composition | Solution that includes polysiloxane (A) | | Crosslinking accelerator (B) | | Solvent (C) | |
|---|---|---|---|---|---|---|---|
|  |  | Type | Amount blended (parts by mass) | Type | Amount blended (parts by mass) | Type | Amount blended (parts by mass) |
| Example 1 | P-1 | A-1 | 9.70 | B-2 | 0.05 | C-1/C-2 | 68.74/21.51 |
| Example 2 | P-2 | A-3 | 9.70 | B-2 | 0.05 | C-1/C-2 | 68.74/21.51 |
| Example 3 | P-3 | A-3 | 9.70 | B-1 | 0.05 | C-1/C-2 | 68.74/21.51 |
| Example 4 | P-4 | A-3 | 9.70 | B-3 | 0.05 | C-2/C-3 | 68.74/21.51 |
| Example 5 | P-5 | A-3 | 9.70 | B-4 | 0.05 | C-1/C-2 | 68.74/21.51 |
| Example 6 | P-6 | A-2 | 9.70 | B-2 | 0.05 | C-1/C-2 | 68.74/21.51 |
| Example 7 | P-7 | A-1 | 9.70 | B-5 | 0.05 | C-1/C-2 | 68.74/21.51 |
| Example 8 | P-8 | A-1 | 9.70 | B-6 | 0.05 | C-1/C-2 | 68.74/21.51 |
| Example 9 | P-9 | A-1 | 9.70 | B-7 | 0.05 | C-1/C-2 | 68.74/21.51 |
| Comparative Example 1 | p-1 | a-1 | 9.70 | B-2 | 0.05 | C-1/C-2 | 68.74/21.51 |
| Comparative Example 2 | p-2 | a-2 | 9.70 | B-2 | 0.05 | C-1/C-2 | 68.74/21.51 |
| Comparative Example 3 | p-3 | A-1 | 9.70 | — | — | C-1/C-2 | 68.74/21.51 |
| Comparative Example 4 | p-4 | a-3 | 9.70 | B-2 | 0.05 | C-1/C-2 | 68.74/21.51 |

Preparation of Photoresist Composition

Synthesis of Base Polymer

Synthesis Example 7

A solution was prepared which was obtained by dissolving 11.92 g of (Q-1) a compound, 41.07 g of (Q-2) a compound, 15.75 g of (Q-3) a compound, 11.16 g of (Q-4) a compound and 20.10 g of (Q-5) a compound represented by the following formulae, and 3.88 g of dimethyl 2,2'-azobis(2-isobutyronitrile) (polymerization initiator) in 200 g of 2-butanone. A 1,000 mL three-necked flask was charged with 100 g of 2-butanone and the mixture was purged with nitrogen for 30 minutes, followed by heating the reaction vessel at 80° C. with stirring. The prepared solution was added dropwise over 4 hours to the mixture, and further after completion of the dropping, the mixture was aged at 80° C. for 2 hours. After completion of the polymerization, the polymerization reaction liquid was cooled to no greater than 30° C. by water cooling. The polymerization reaction liquid was concentrated in vacuo using an evaporator until the mass reached 200 g. Thereafter, the concentrated polymerization reaction liquid was charged into 1,000 g of methanol and reprecipitation operation was performed. The deposited slurry was filtered off by vacuum filtration, and the solid content was washed with methanol three times. The obtained powder was dried in vacuo at 60° C. for 15 hours to obtain 88.0 g (yield: 88%) of (G) a polymer (base polymer) which was a white powder. The Mw of the obtained polymer (G) was 9,300 and the Mw/Mn of the obtained polymer (G) was 1.60. As a result of $^{13}$C-NMR analysis, the proportions of structural units derived from the compounds (Q-1), (Q-2), (Q-3), (Q-4) and (Q-5) contained were 16 mol %, 26 mol %, 19 mol %, 11 mol % and 28 mol %, respectively. It is to be noted that the $^{13}$C-NMR analysis was carried out using a nuclear magnetic resonance apparatus (JNM-ECP500, manufactured by JEOL, Ltd.).

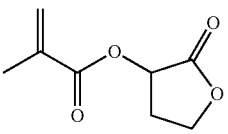
(Q-5)

Synthesis of Fluorine-Containing Polymer

Synthesis Example 8

A 100 mL three-necked flask was charged with a solution prepared by dissolving 3.8 g of (Q-6) a compound and 1.2 g of (Q-7) a compound represented by the following formulae into 10 g of 2-butanone and further dissolving 0.09 g of 2,2'-azobis(2-isobutyronitrile). The mixture was purged with nitrogen for 30 minutes and thereafter the reaction vessel was heated at 80° C. with stirring. The time when heating was started was assumed to be a start time point of polymerization and the polymerization reaction was carried out for 6 hours. After completion of the polymerization, the polymerization reaction liquid was cooled to no greater than 30° C. by water cooling and the polymerization reaction liquid was concentrated in vacuo by an evaporator until the mass reached 12.5 g. The concentrated polymerization reaction liquid was slowly charged into 75 g of n-hexane cooled to 0° C. to allow the solid content to be deposited. The liquid was filtered, the solid content was washed with n-hexane and the obtained powder was dried in vacuo at 40° C. for 15 hours to obtain 3.75 g (yield: 75%) of (F) a polymer (fluorine-containing polymer) which was a white powder. The Mw of the polymer (F) was 9,400 and the Mw/Mn of the polymer (F) was 1.50. As a result of $^{13}$C-NMR analysis, the proportions of structural units derived from the compounds (Q-6) and (Q-7) contained were 68.5 mol % and 31.5 mol %, respectively, and the percentage of a fluorine atom contained was 21.4% by mass.

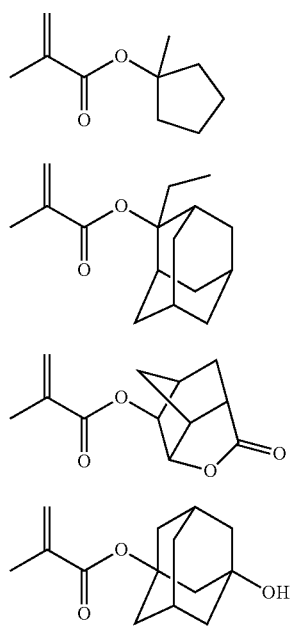

(Q-1)

(Q-2)

(Q-3)

(Q-4)

(Q-6)

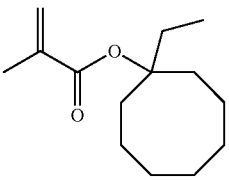
(Q-7)

Preparation of Resist Composition

Synthesis Example 9

100 parts by mass of the polymer (G) that serves as a base polymer, 5 parts by mass of the polymer (F) that serves as a fluorine-containing polymer, 8 parts by mass of triphenylsulfonium trifluoromethanesulfonate and 0.6 parts by mass of the compound represented by the formula (B-1) that serves as an acid diffusion control agent were added to 1,881 parts by mass of propylene glycol monomethyl ether acetate, 806 parts by mass of cyclohexanone, and 200 parts by mass of γ-butyrolactone that serve as solvents to prepare a solution. The solution was filtered through a membrane filter with a pore size of 0.1 μm to prepare (H) a resist composition.

Formation of Silicon-Containing Film

The polysiloxane compositions obtained in the Examples and Comparative Examples were coated on a silicon wafer by a spin coating method using a coater/developer (CLEAN TRACK ACT 12, manufactured by Tokyo Electron Ltd., the same was used for coating unless otherwise described particularly in the following). The resulting coating film was subjected to PB on a hot plate at 200° C. for 1 minute to provide silicon-containing films. The film thickness of the obtained films measured by a film thickness measuring apparatus (M-2000D, manufactured by J. A. Woollam) was 100 nm.

Evaluations

The obtained silicon-containing films were evaluated as shown below. The obtained results are shown in Table 3.

Substrate Reflectance

The refractive index parameter (n) and the extinction coefficient (k) of the each silicon-containing film obtained, a composition for forming an organic underlayer film ("NFC HM8006" manufactured by JSR Corporation), and the resist composition obtained in the Synthesis Example 9 were measured using a high-speed spectroscopic ellipsometer ("M-2000" manufactured by J. A. Woollam). The substrate reflectance under a condition involving NA of 1.3 and Dipole, of a film obtained by laminating a resist film provided from the resist composition, the silicon-containing film and a film provided from the composition for forming a resist underlayer film was determined from the measured values using a simulation software ("Prolith" manufactured by KLA-Tencor). The evaluation was made as: "A" (favorable) in the case in which the substrate reflectance was no greater than 1%; and "B" (unfavorable) in the case in which the substrate reflectance was greater than 1%.

Residual Resist Amount

The resist composition was spin-coated onto the each silicon-containing film provided on the substrate, and prebaked (PB) at 100° C. for 60 seconds on a hot plate to provide a resist film having a thickness of 100 nm. Next, the entire surface of the resist film was exposed using an ArF immersion scanner ("S306C" manufactured by Nikon Corporation). Next, the resist film was developed with a 2.38% by mass aqueous TMAH solution for 1 minute, and then the film thickness of the film (i.e., the silicon-containing film and the residual resist film) on the substrate was measured using the film thickness measuring apparatus. The difference between the film thickness of the silicon-containing film before exposure and the film thickness described above was taken as the residual resist amount (nm). The measured values of the residual resist amount are shown in Table 3. The evaluation may be made as: "favorable" in the case in which the residual resist amount was less than 5 nm; "somewhat favorable" in the case in which the residual resist amount was no less than 5 nm and no greater than 10 nm; and "unfavorable" in the case in which the residual resist amount exceeds 10 nm.

Alkaline Resistance

A silicon wafer on which a silicon-containing film had been provided was immersed in an aqueous TMAH solution for 1 minute, and the film thicknesses before and after the treatment were determined. In the case in which the difference of the film thicknesses before and after the treatment was no greater than 1 nm, the alkaline resistance was evaluated as "A" (favorable), and in the case in which the difference of the film thicknesses before and after the treatments exceeds 1 nm was evaluated as "B" (unfavorable).

Dry-Etching Rate

The etching rate (nm/min) was calculated by determining the difference of the film thicknesses of the silicon-containing film provided before and after the treatment using an etching apparatus (Telius SCCM, manufactured by Tokyo Electron Limited). Etching conditions were shown below. Table 3 reveals the etching rate in respective cases of etching with a fluorine gas and etching with an oxygen gas, and the ratio of the etching rate to that in Comparative Example 1.

Etching with Fluorine Gas

A mixed gas of $CHF_3$, Ar and $O_2$ was passed into a treatment container having a pressure of 250 mTorr to generate plasma with RF power of 500 W, and a process treatment was carried out for 30 seconds.

Etching with Oxygen Gas

A mixed gas of $O_2$ and Ar was passed into a treatment container having a pressure of 5 mTorr to generate plasma with RF power of 750 W, and a process treatment was carried out for 60 seconds.

Lithography Evaluation

Formation of Resist Pattern

After a composition for forming an organic underlayer film (HM8006, manufactured by JSR Corporation) was spin-coated on a 12 inch silicon wafer, PB was carried out at 250° C. for 60 seconds to provide an organic underlayer film having a film thickness of 100 nm. On this organic underlayer film, polysiloxane compositions of Examples and Comparative Examples were spin-coated, and subjected to PB at 220° C. for 60 seconds, followed by cooling at 23° C. for 60 seconds to provide a silicon-containing film having a film thickness of 30 nm. Next, the resist composition (H) obtained in the Synthesis Example 9 was spin-coated on the silicon-containing film, and subjected to PB at 100° C. for 60 seconds, followed by cooling at 23° C. for 30 seconds to provide a resist film having a film thickness of 100 nm.

Subsequently, exposure was carried out through a mask having a mask size for formation of 42 nm line/84 nm pitch using an ArF Immersion Scanner ("S610C", manufactured by NIKON) under an optical condition of dipole with NA of 1.30. Post exposure baking (PEB) was carried out on a hot plate of the aforementioned coater/developer at 100° C. for 60 seconds, followed by cooling at 23° C. for 30 seconds. Thereafter, puddle development was carried out for 30 seconds with an LD nozzle of a cup for development using an aqueous TMAH solution as a developer, followed by rinsing with ultra pure water. Thereafter, a resist pattern of 42 nm line/84 nm pitch was formed by spin-drying through swinging off at 2,000 rpm for 15 seconds.

Evaluation

The minimum pre-collapse dimension was evaluated by the following methods using the test substrate. The resist pattern was measured and observed using a scanning electron microscope ("CG-4000" manufactured by Hitachi High-Technologies Corporation).

In the formation of the resist pattern, a dose (mJ/cm$^2$) at which a resist pattern having a line width of 42 nm and a line-to-line distance (space) of 84 nm (i.e., ratio of line-and-space is 1:2) was formed was defined as an optimum dose. The exposure step was performed while increasing the dose stepwise from the optimum exposure dose. In this case, since the line width of the pattern obtained gradually decreases, the resist pattern collapse is observed when the resist pattern has a line width corresponding to a given dose. A line width corresponding to the maximum dose at which the resist pattern did not collapse was defined as the minimum pre-collapse dimension (nm), and used as an index of the pattern collapse resistance. The pattern collapse resistance was evaluated as "A" (favorable) in the case in which the minimum pre-collapse dimension was no greater than 42 nm, and as "B" (unfavorable) in the case in which the minimum pre-collapse dimension exceeded 42 nm.

TABLE 3

|  | Polysiloxane composition | Substrate reflectance | Residual resist amount (nm) | Alkaline resistance | Etching with fluorine gas | | Etching with oxygen gas | | Lithography evaluation |
|---|---|---|---|---|---|---|---|---|---|
|  |  |  |  |  | Etching rate (nm/min) | Ratio to Comparative Example 1 | Etching rate (nm/min) | Ratio to Comparative Example 1 |  |
| Example 1 | P-1 | A | <1 | A | 104 | 1.06 | 23 | 1.00 | A |
| Example 2 | P-2 | A | <1 | A | 106 | 1.08 | 22 | 0.96 | A |
| Example 3 | P-3 | A | <1 | A | 106 | 1.08 | 22 | 0.96 | A |
| Example 4 | P-4 | A | <1 | A | 106 | 1.08 | 22 | 0.96 | A |
| Example 5 | P-5 | A | <1 | A | 106 | 1.08 | 22 | 0.96 | A |
| Example 6 | P-6 | A | <1 | A | 103 | 1.05 | 22 | 0.96 | A |
| Example 7 | P-7 | A | <1 | A | 100 | 1.02 | 23 | 1.00 | A |
| Example 8 | P-8 | A | <1 | A | 103 | 1.05 | 22 | 0.96 | A |
| Example 9 | P-9 | A | <1 | A | 104 | 1.06 | 23 | 1.00 | A |
| Comparative Example 1 | p-1 | A | <1 | A | 98 | 1.00 | 23 | 1.00 | A |
| Comparative Example 2 | p-2 | A | <1 | A | 93 | 0.95 | 23 | 1.00 | A |
| Comparative Example 3 | p-3 | A | <1 | B | 123 | 1.26 | 30 | 1.30 | B |
| Comparative Example 4 | p-4 | A | <1 | A | 99 | 1.01 | 22 | 0.96 | A |

The results shown in Table 3 reveals that according to the pattern-forming method and the polysiloxane composition of the present invention processability with a fluorine gas and resistance against an oxygen gas can be together improved to form a pattern while the resulting basic performances such as substrate reflectance and alkaline resistance of the silicon-containing film, and pattern collapse resistance of the resist pattern formed are favorably maintained.

INDUSTRIAL APPLICABILITY

According to the pattern-forming method and the polysiloxane composition of the present invention, processability with a fluorine gas and resistance against an oxygen gas can be together improved to form a pattern. Therefore, the pattern-forming method and the polysiloxane composition of the present invention can be suitably used for pattern formation in a finer scale than 90 nm using an ArF excimer laser beam, an ArF excimer laser beam in a liquid immersion exposure, an $F_2$ excimer laser beam, an EUV light, a nanoimprint technology, and the like, in which miniaturization, thinning, and the like have further proceeded, of the multilayer resist processes.

What is claimed is:
1. A pattern-forming method comprising:
   (1) providing a silicon-containing film on an upper face side of a substrate to be processed using a polysiloxane composition;
   (2) forming a resist pattern on the silicon-containing film;
   (3) dry-etching the silicon-containing film using the resist pattern as a mask to form a silicon-containing pattern; and
   (4) dry-etching the substrate to be processed using the silicon-containing pattern as a mask to form a pattern, wherein the polysiloxane composition comprises:
   (A) a polysiloxane comprising a fluorine atom;
   (B) a crosslinking accelerator; and
   (C) water,
wherein the polysiloxane (A) comprises a fluorinated hydrocarbon group which may be substituted, and the fluorinated hydrocarbon group which may be substituted is a fluorinated alkyl group, a fluorinated alicyclic hydrocarbon group, a pentafluorophenyl group, a fluorinated aryl group other than a fluorinated phenyl group, or a fluorinated aralkyl group, and
wherein the crosslinking accelerator (B) is a nitrogen-containing compound which generates a compound having a basic amino group by heating.

2. The pattern-forming method according to claim 1, wherein the step (2) further comprises:
   (2-A1) providing a resist film on the silicon-containing film using a resist composition;
   (2-A2) exposing the resist film by irradiation with an exposure light through a photomask; and
   (2-A3) developing the exposed resist film.

3. The pattern-forming method according to claim 1, further comprising:
   (0) providing a resist underlayer film that is an organic film on the substrate to be processed, wherein the silicon-containing film is provided on the resist underlayer film in the step (1), and the resist underlayer film is further dry-etched in the step (4).

4. The pattern-forming method according to claim 1, wherein the polysiloxane (A) is a hydrolytic condensation product of a compound that includes a silane compound represented by formula (1):

wherein, in the formula (1), $R^1$ represents a monovalent hydrocarbon group having a fluorine atom, wherein a part or all of hydrogen atoms contained in the hydrocarbon group may be substituted; $R^2$ represents a hydrogen atom or a monovalent hydrocarbon group, wherein the hydrocarbon group may be substituted with a group which is other than a fluorine atom and which is other than a group having a fluorine atom; X represents a halogen atom or —OR$^3$, wherein R$^3$ represents a monovalent organic group; a is an integer of 1 to 3; and b is an integer of 0 to 2, wherein (a+b)≤3 is satisfied, and in the case in which R$^1$, R$^2$ and X are each present in a plurality of number, the R$^1$s, R$^2$s and Xs present in a plurality of number may be each the same or different.

5. The pattern-forming method according to claim 1, wherein a content of the polysiloxane (A) is no less than 70% by mass based on a total solid content of the polysiloxane composition.

6. The pattern-forming method according to claim 1, wherein a content of the polysiloxane (A) is no less than 80% by mass based on a total solid content of the polysiloxane composition.

7. The pattern-forming method according to claim 1, wherein a content of the crosslinking accelerator (B) in the polysiloxane composition is 0.01 parts by mass to 10 parts by mass with respect to 100 parts by mass of the polysiloxane (A).

8. The pattern-forming method according to claim 1, wherein a content of the crosslinking accelerator (B) in the polysiloxane composition is 0.05 parts by mass to 6 parts by mass with respect to 100 parts by mass of the polysiloxane (A).

9. The pattern-forming method according to claim 1, wherein a content of the crosslinking accelerator (B) in the polysiloxane composition is 0.2 parts by mass to 5 parts by mass with respect to 100 parts by mass of the polysiloxane (A).

10. The pattern-forming method according to claim 1, wherein a content of the crosslinking accelerator (B) in the polysiloxane composition is 0.5 parts by mass to 4 parts by mass with respect to 100 parts by mass of the polysiloxane (A).

11. The pattern-forming method according to claim 1, wherein the polysiloxane composition further comprises a solvent.

12. The pattern-forming method according to claim 1 wherein a content of the water (C) in the polysiloxane composition is 0.1% by mass to 20% by mass.

13. The pattern-forming method according to claim 1, wherein a content of the water (C) in the polysiloxane composition is 0.2% by mass to 15% by mass.

* * * * *